(12) United States Patent
Liu et al.

(10) Patent No.: US 11,101,209 B2
(45) Date of Patent: Aug. 24, 2021

(54) REDISTRIBUTION STRUCTURES IN SEMICONDUCTOR PACKAGES AND METHODS OF FORMING SAME

(71) Applicant: Taiwan Semiconductor Manufacturing Company, Ltd., Hsinchu (TW)

(72) Inventors: Chung-Shi Liu, Hsinchu (TW); Chien-Hsun Lee, Chu-tung Town (TW); Jiun Yi Wu, Zhongli (TW); Hao-Cheng Hou, Hsinchu (TW); Hung-Jen Lin, Tainan (TW); Jung Wei Cheng, Hsinchu (TW); Tsung-Ding Wang, Tainan (TW); Yu-Min Liang, Zhongli (TW); Li-Wei Chou, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 121 days.

(21) Appl. No.: 16/051,817

(22) Filed: Aug. 1, 2018

(65) Prior Publication Data
US 2019/0103353 A1    Apr. 4, 2019

Related U.S. Application Data

(60) Provisional application No. 62/566,018, filed on Sep. 29, 2017.

(51) Int. Cl.
*H01L 23/522* (2006.01)
*H01L 23/00* (2006.01)
(Continued)

(52) U.S. Cl.
CPC ........ *H01L 23/5226* (2013.01); *H01L 21/563* (2013.01); *H01L 21/566* (2013.01);
(Continued)

(58) Field of Classification Search
CPC . H01L 23/5226; H01L 21/563; H01L 21/566; H01L 21/6835; H01L 21/76816;
(Continued)

(56) References Cited

U.S. PATENT DOCUMENTS 6,351,031 B1 * 2/2002 Iijima ................... H01L 21/563
257/635
7,830,004 B2 * 11/2010 Wu ........................ H01L 23/142
257/729
(Continued)

FOREIGN PATENT DOCUMENTS

CN      103681561 A      3/2014
KR     20150098734 A      8/2015
(Continued)

*Primary Examiner* — Allen L Parker
*Assistant Examiner* — Charles N Ausar-El
(74) *Attorney, Agent, or Firm* — Slater Matsil, LLP

(57) ABSTRACT

An embodiment semiconductor package includes a bare semiconductor chip, a packaged semiconductor chip adjacent the bare semiconductor chip, and a redistribution structure bonded to the bare semiconductor chip and the packaged semiconductor chip. The redistribution structure includes a first redistribution layer having a first thickness; a second redistribution layer having a second thickness; and a third redistribution layer between the first redistribution layer and the second redistribution layer. The third redistribution layer has a third thickness greater than the first thickness and the second thickness. The package further includes an underfill disposed between the bare semiconductor chip and the redistribution structure and a molding compound encapsulating the bare semiconductor chip, the packaged semiconductor chip, and the underfill.

19 Claims, 29 Drawing Sheets

(51) Int. Cl.
*H01L 21/56* (2006.01)
*H01L 23/31* (2006.01)
*H01L 21/768* (2006.01)
*H01L 21/683* (2006.01)
*H01L 23/498* (2006.01)

(52) U.S. Cl.
CPC .... *H01L 21/6835* (2013.01); *H01L 21/76816* (2013.01); *H01L 23/3157* (2013.01); *H01L 23/49822* (2013.01); *H01L 24/09* (2013.01); *H01L 24/81* (2013.01); *H01L 23/49816* (2013.01); *H01L 24/13* (2013.01); *H01L 2221/68345* (2013.01); *H01L 2221/68359* (2013.01); *H01L 2221/68381* (2013.01); *H01L 2224/02331* (2013.01); *H01L 2224/13101* (2013.01); *H01L 2224/13111* (2013.01); *H01L 2224/13147* (2013.01); *H01L 2224/13155* (2013.01); *H01L 2224/16225* (2013.01); *H01L 2224/32225* (2013.01); *H01L 2224/73204* (2013.01); *H01L 2224/81005* (2013.01); *H01L 2224/81193* (2013.01); *H01L 2224/81801* (2013.01); *H01L 2924/1436* (2013.01); *H01L 2924/15311* (2013.01); *H01L 2924/18161* (2013.01)

(58) Field of Classification Search
CPC ........... H01L 23/3157; H01L 23/49822; H01L 24/09; H01L 24/81
See application file for complete search history.

(56) References Cited

U.S. PATENT DOCUMENTS

| | | | | |
|---|---|---|---|---|
| 8,039,303 B2* | 10/2011 | Shim, II | ............ | H01L 23/5384 438/107 |
| 8,253,244 B2* | 8/2012 | Kang | .................... | G11C 5/063 257/724 |
| 8,993,380 B2 | 3/2015 | Hou et al. | | |
| 9,177,926 B2* | 11/2015 | Scanlan | ................. | H01L 23/48 |
| 9,281,254 B2 | 3/2016 | Yu et al. | | |
| 9,299,649 B2 | 3/2016 | Chiu et al. | | |
| 9,324,582 B2* | 4/2016 | Lin | .................... | H01L 23/3114 |
| 9,343,442 B2 | 5/2016 | Chen et al. | | |
| 9,372,206 B2 | 6/2016 | Wu et al. | | |
| 9,425,126 B2 | 8/2016 | Kuo et al. | | |
| 9,425,178 B2* | 8/2016 | Lin | ................. | H01L 21/31053 |
| 9,443,783 B2 | 9/2016 | Lin et al. | | |
| 9,461,018 B1 | 10/2016 | Tsai et al. | | |
| 9,496,189 B2 | 11/2016 | Yu et al. | | |
| 9,553,059 B2* | 1/2017 | Tsai | .................... | H01L 23/5384 |
| 9,576,919 B2* | 2/2017 | Scanlan | ................. | H01L 24/13 |
| 9,666,502 B2 | 5/2017 | Chen et al. | | |
| 9,735,131 B2* | 8/2017 | Su | .................... | H01L 25/0657 |
| 9,768,145 B2* | 9/2017 | Yu | .................... | H01L 23/49838 |
| 10,079,157 B2* | 9/2018 | Paek | ................ | H01L 23/49822 |
| 10,242,973 B2* | 3/2019 | Baek | ................ | H01L 23/5389 |
| 10,347,612 B2 | 7/2019 | Lin et al. | | |
| 10,403,579 B2* | 9/2019 | Lee | .................... | H01L 21/4853 |
| 10,541,213 B2* | 1/2020 | Tsai | .................... | H01L 23/5389 |
| 10,804,242 B2* | 10/2020 | Yu | .................... | H01L 23/49811 |
| 2004/0099884 A1 | 5/2004 | Fulcher | | |
| 2006/0128069 A1* | 6/2006 | Hsu | .................... | H01L 24/82 438/124 |
| 2006/0199387 A1* | 9/2006 | Rhodes | ............. | H01L 21/76843 438/687 |
| 2009/0321915 A1* | 12/2009 | Hu | .................... | H01L 23/5389 257/690 |
| 2010/0264552 A1 | 10/2010 | Nakasato et al. | | |
| 2010/0269336 A1 | 10/2010 | Mayder | | |
| 2011/0068484 A1* | 3/2011 | Meyer | ................. | H01L 24/19 257/782 |
| 2011/0156233 A1* | 6/2011 | Kim | ................ | H01L 21/76898 257/686 |
| 2013/0062761 A1* | 3/2013 | Lin | ................... | H01L 21/565 257/738 |
| 2014/0076617 A1* | 3/2014 | Chen | ................... | H01L 23/645 174/255 |
| 2014/0103488 A1* | 4/2014 | Chen | ................ | H01L 24/19 257/532 |
| 2014/0183731 A1* | 7/2014 | Lin | ................... | H01L 24/97 257/738 |
| 2014/0185264 A1* | 7/2014 | Chen | ................... | H01L 25/0652 361/814 |
| 2014/0252626 A1* | 9/2014 | Kang | ................... | H01L 25/0657 257/751 |
| 2014/0264840 A1* | 9/2014 | Lin | ................... | H01L 24/97 257/737 |
| 2014/0353833 A1* | 12/2014 | Peng | ................. | H01L 21/82345 257/771 |
| 2015/0084206 A1* | 3/2015 | Lin | ................... | H01L 23/5389 257/774 |
| 2015/0130050 A1* | 5/2015 | Lin | .................. | H01L 23/49827 257/737 |
| 2015/0235915 A1* | 8/2015 | Liang | ................... | H01L 24/97 361/764 |
| 2015/0325509 A1* | 11/2015 | We | ................... | H01L 21/31127 257/774 |
| 2016/0064315 A1* | 3/2016 | Wu | ................... | H01L 21/4853 361/783 |
| 2016/0218082 A1 | 7/2016 | Lee et al. | | |
| 2016/0240480 A1* | 8/2016 | Lin | ................... | H01L 25/50 |
| 2016/0260695 A1* | 9/2016 | Chung | ................... | H01L 25/18 |
| 2016/0329272 A1* | 11/2016 | Geissler | ................. | H01L 24/83 |
| 2017/0005023 A1* | 1/2017 | Chen | ................... | H01L 21/561 |
| 2017/0011993 A1 | 1/2017 | Zhao et al. | | |
| 2017/0018505 A1* | 1/2017 | Lin | ................... | H01L 23/5389 |
| 2017/0062383 A1* | 3/2017 | Yee | ................... | H01L 25/18 |
| 2017/0084591 A1* | 3/2017 | Magnus | ........... | H01L 23/49838 |
| 2017/0263579 A1* | 9/2017 | Hu | ................... | H01L 24/02 |
| 2017/0365581 A1* | 12/2017 | Yu | ................... | H01L 23/3142 |
| 2018/0025973 A1 | 1/2018 | Fu et al. | | |
| 2018/0174974 A1* | 6/2018 | Kim | ................... | H01L 24/08 |
| 2018/0182691 A1* | 6/2018 | Cho | ................... | H01L 24/20 |
| 2018/0308823 A1* | 10/2018 | Lin | ................... | H01L 25/0657 |
| 2019/0096816 A1* | 3/2019 | Ho | ................... | H01L 21/78 |
| 2020/0312772 A1* | 10/2020 | Xi | ................... | H01L 23/5386 |

FOREIGN PATENT DOCUMENTS

| | | |
|---|---|---|
| KR | 20150105183 A | 9/2015 |
| KR | 20160100185 A | 8/2016 |
| WO | 2016165074 A1 | 10/2016 |

* cited by examiner

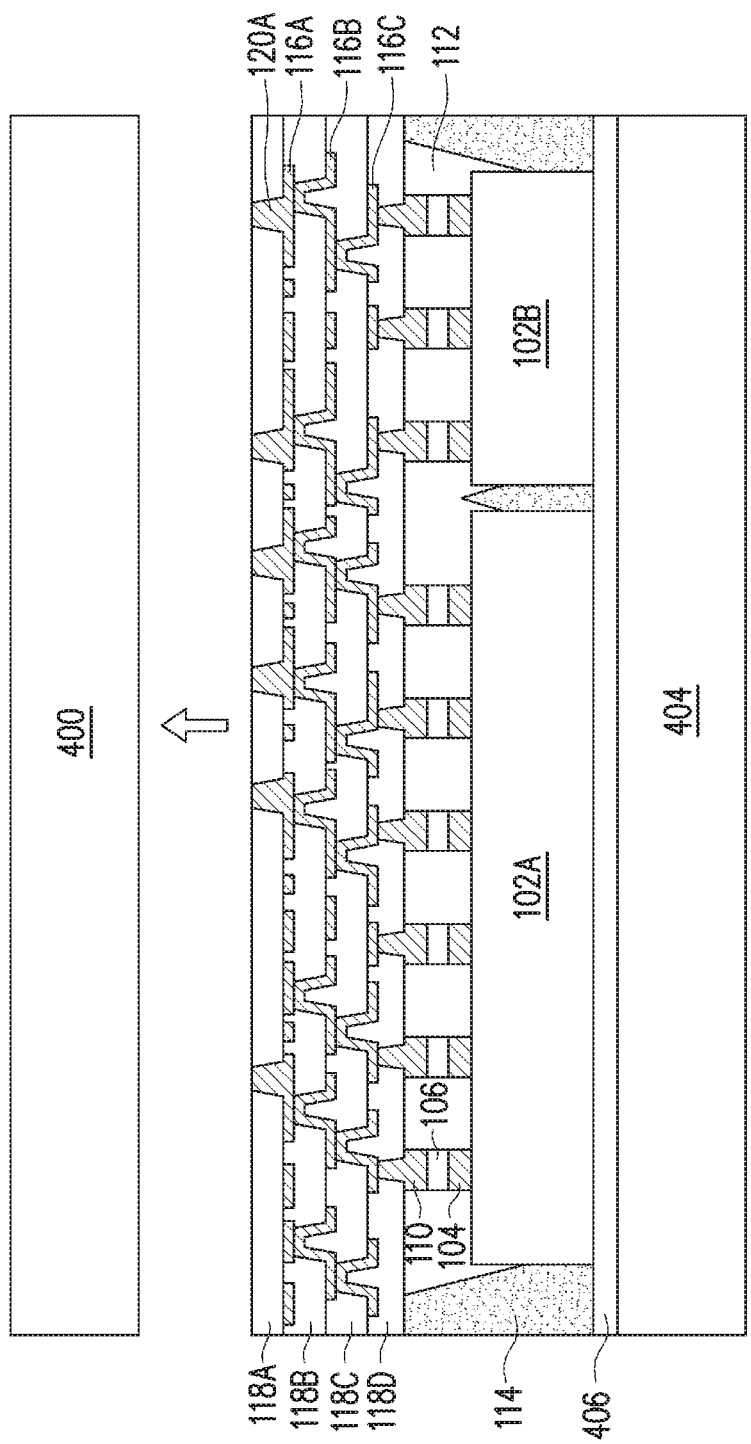

REDISTRIBUTION STRUCTURES IN SEMICONDUCTOR PACKAGES AND METHODS OF FORMING SAME

PRIORITY CLAIM AND CROSS-REFERENCE

This application claims the benefits of U.S. Provisional Application Ser. No. 62/566,018, filed on Sep. 29, 2017, which application is hereby incorporated herein by reference in its entirety.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A, 4B, 4C, 4D, 4E, 4F, 4G, 4H, 4I, 4J, and 4K illustrate cross-sectional views of various intermediary steps of forming a semiconductor package in accordance with some embodiments.

DETAILED DESCRIPTION

Figure 1A:
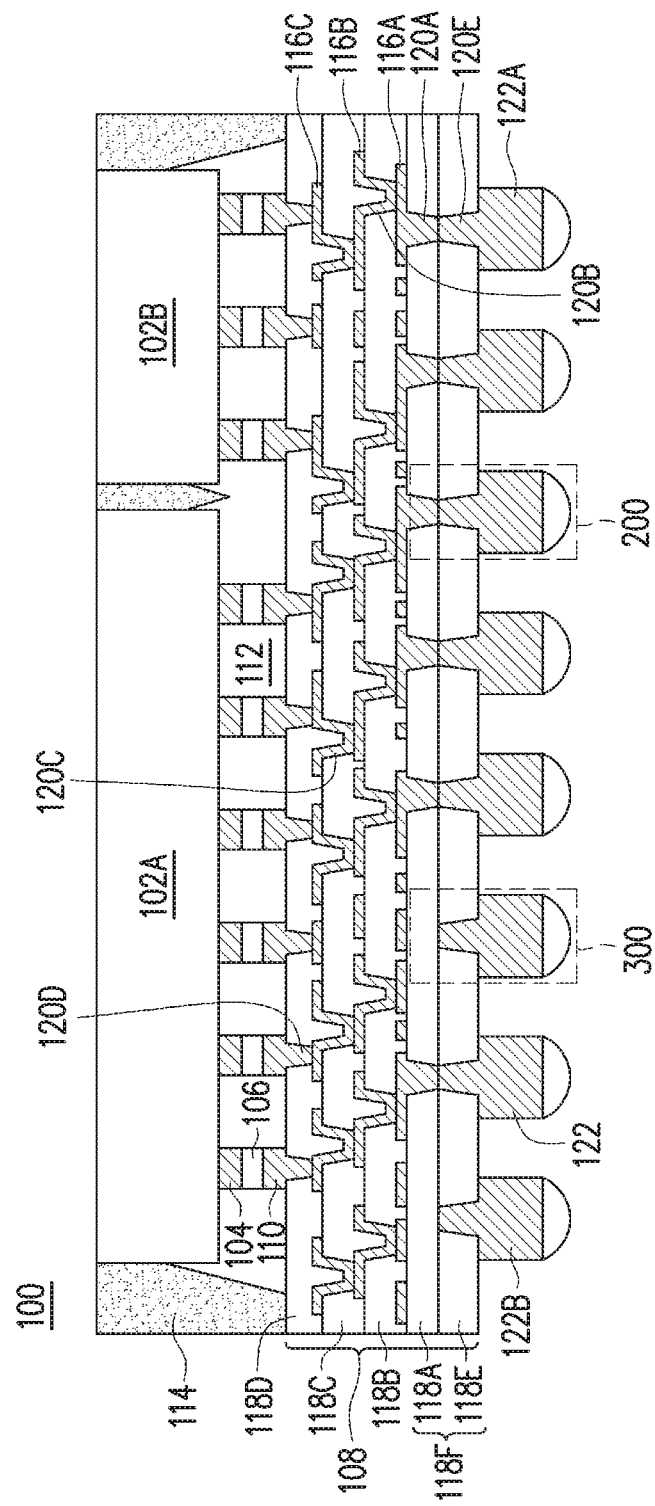
FIGS. 1A, 1B, 1C, 2A, 2B, 2C, and 3 illustrate cross-sectional views of a semiconductor package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a package structure with fan-out redistribution structures to enhance flexibility of heterogeneous chips integration. For example, flip-chip ball grid array (BGA) packages may face substrate routing capability limitation for high density interconnection. As a specific example, hybrid memory (HBM) dynamic random access memory (DRAM) may desire fine pitch conductive trace routing (e.g., having pitches of about 2 µm or less), and embodiment fan-out redistribution structures and processes provide an approach for manufacturing such high density interconnections. Thermal budget issues regarding DRAM degradation is also concern, and various embodiments address this thermal budget issue by mounting devices (e.g., bare chips and/or packaged chips) after redistribution structure formation to reduce the thermal impact on the devices. For improved electrical performance, top redistribution layers may need to include fine lines; however, these fine lines are more likely to break as a result of stress from external connectors of the package. Embodiments may provide stress reduction features, such as, an increased top polymer layer (e.g., the polymer layer where the external connectors are located) thickness to provide a stress buffer layer between the redistribution layers and the connectors. Dummy connector peeling issues (e.g., during a carrier de-bond process) may also be addressed by various embodiments.

Figure 1B:
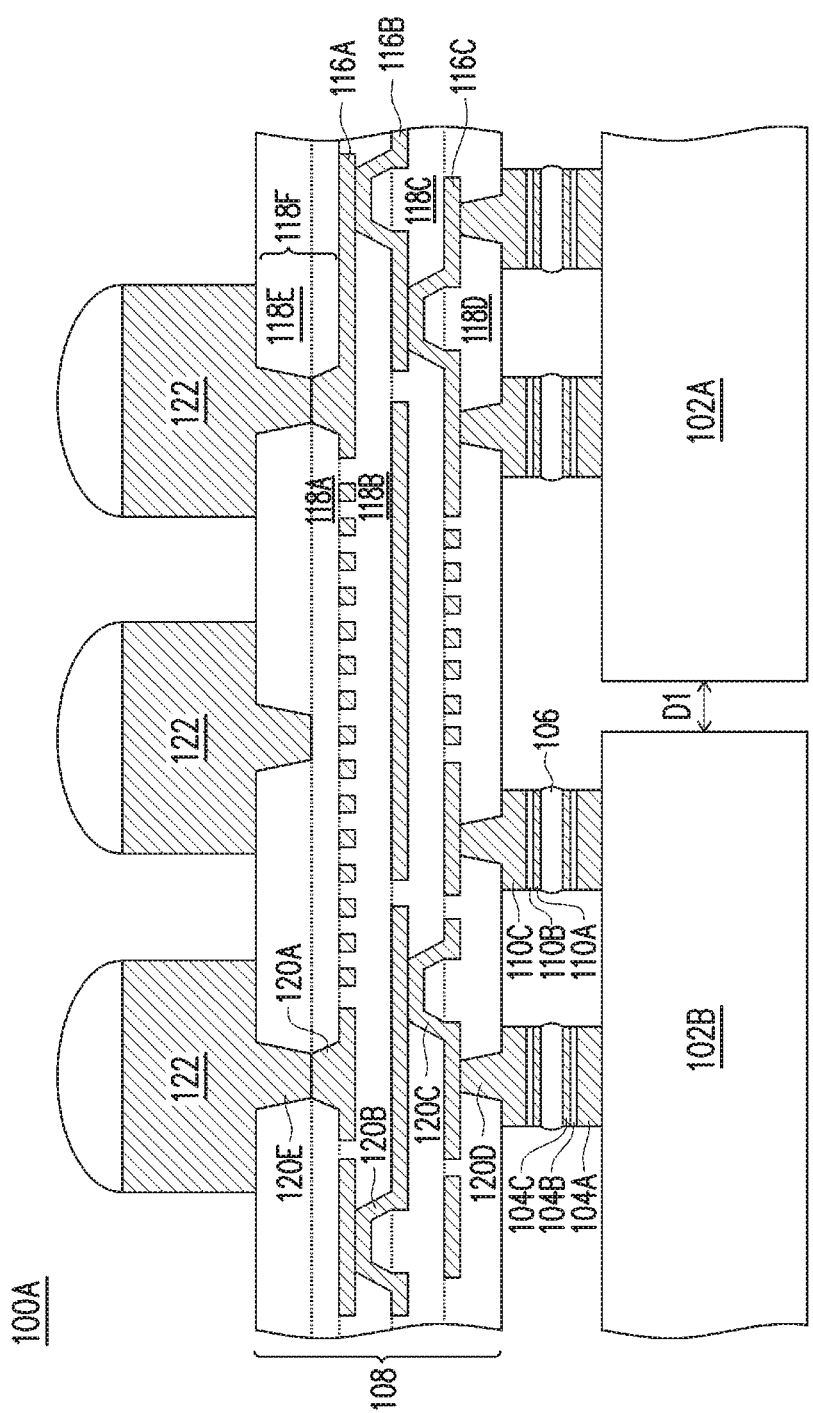
Figure 1C:
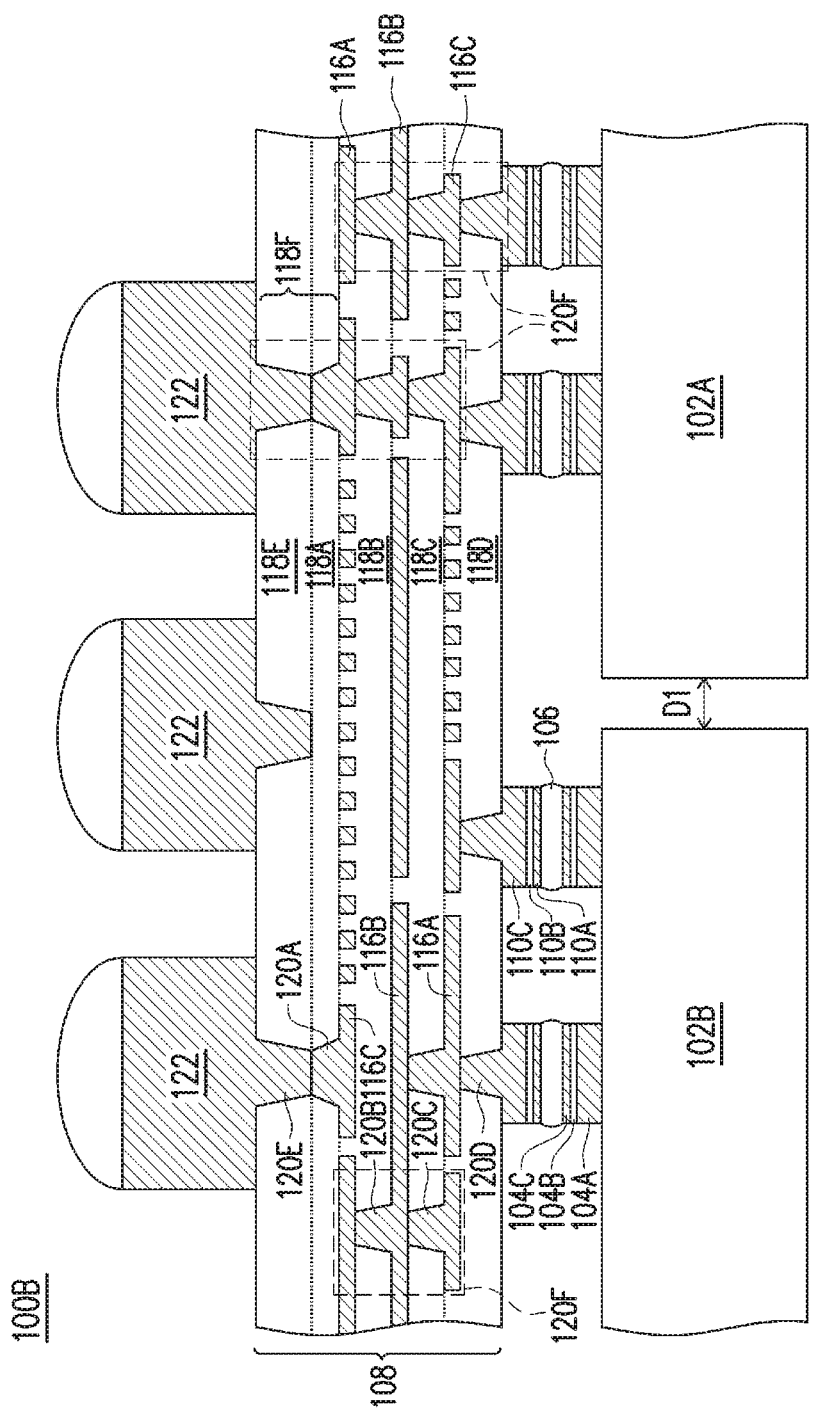

FIG. 1A illustrates a cross-sectional view of an embodiment package 100 comprising a first device 102A and a second device 102B. FIGS. 1B and 1C illustrate cross-sectional views of the embodiment packages 100A/100B, which provide detailed views of package 100 without a molding compound 114 or underfill 112 for greater clarity.

In some embodiments, devices 102A and 102B may be bare chip semiconductor dies (e.g., unpackaged semiconductor dies). In other embodiments, at least one of the devices 102A and 102B may be a semiconductor package including one or more packaged semiconductor dies, passive devices, redistribution structures, encapsulant, and the like.

In some embodiments, devices 102A and 102B include a combination of bare chip semiconductor die(s) and semiconductor package(s). For example, the devices 102A and 102B may be and/or include logic dies (e.g., central processing unit, microcontroller, etc.), memory dies (e.g., dynamic random access memory (DRAM) die, hybrid memory cube (HBC), static random access memory (SRAM) die, a wide input/output (wideIO) memory die, magnetoresistive random access memory (mRAM) die, resistive random access memory (rRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), a combination thereof, or the like. The devices 102A and 102B may perform the same type of functions or different types of functions. In some embodiments, the devices 102A and 102B may be different sizes (e.g., different heights and/or surface areas), and in other embodiments, the devices 102A and 102B may be the same size (e.g., same heights and/or surface areas).

Before being included in package 100, the devices 102A and 102B may be processed according to applicable manufacturing processes to form integrated circuits in the devices 102A and 102B. For example, the devices 102A and 102B may each include a semiconductor substrate, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate and may be interconnected by interconnect structures 120 formed by, for example, metallization patterns in one or more dielectric layers on the semiconductor substrate 118 form an integrated circuit.

The devices 102A and 102B further comprise pads, such as aluminum pads, to which external connections are made. The pads are on what may be referred to as respective active sides of the integrated circuit dies. Passivation films are on the devices 102A and 102B and on portions of the pads. Openings are through the passivation films to the pads.

Device connectors 104 are electrically coupled to the respective pads within the devices 102A and 102B. In embodiments where the devices 102A and/or 102B are bare chips, the device connectors 104 may further be mechanically coupled to contact pads in the devices 102A and 102B, for example, through the openings in the passivation films. In embodiments where the devices 102A and/or 102B are packaged chips, redistribution structures may be interposed between and electrically connect the device connectors 104 to bare chips within the devices 102A/102B. The die connectors 104 may be formed by, for example, plating, or the like. In some embodiments, the die connectors 104 each include a nickel layer 104b disposed between two copper layers 104a and 104c (see, e.g., FIGS. 1B and 1C). In other embodiments, the die connectors 104 may have a different configuration and/or have a different material composition. The die connectors 104 electrically couple the respective integrated circuits of the devices 102A and 102B.

The devices 102A and 102B are bonded to a redistribution structure 108. In some embodiments, the devices 102A and 102B are flip chip bonded to contacts no of the redistribution structure 108 using solder 106. Contacts no may be, for example, microbumps (μbumps). The configuration of contacts no may be the same as device connectors 104. For example, the contacts no may each comprise a nickel layer nob disposed between two copper layers 110a and 110c (see, e.g., FIGS. 1B and 1C). In other embodiments, the configuration and/or material composition of contacts no may be different than device connectors 104. For example, in other embodiments, the contacts no may comprise a copper layer, a nickel layer over the copper layer, a palladium layer over the nickel layer, and a gold layer over the palladium layer. Other configurations and/or material compositions are also contemplated for contacts 110 in other embodiments.

Solder 106 is disposed between and bonds the contacts 110 to the device connectors 104. As will be described in greater detail below, solder 106 may be disposed entirely on the contacts 110 prior to bonding, disposed entirely on the device connectors 104 prior to bonding, or partially disposed on both the contacts 110 and the device connectors 104 prior to bonding. The bonding process may comprise placing the devices 102A and 102B on the redistribution structure 108 (e.g., using a pick and place tool) and reflowing the solder 106. During reflow, an intermetallic compound may be formed at an interface between the device connectors 104 and the solder 106, and an intermetallic compound may likewise be formed at an interface between the contacts 110 and the solder 106. The material compositions of the intermetallic compounds at these interfaces may be the same or different and may depend on a composition of the contacts 110, device connectors 104, and solder 106. Example compositions of intermetallic compounds include a copper, nickel, and solder (e.g., tin/silver/copper) composition, a copper and solder (e.g., tin/silver/copper) composition, or the like.

An optional underfill 112 may be disposed between the redistribution structure 108 and the devices 102A/102B. In such embodiments, the underfill 112 may be disposed around the contacts 110, the solder 106, and the device connectors 104. Further, an encapsulant 114 may be disposed around the devices 102A and 102B to encapsulate the devices 102A and 102B. The encapsulant 114 may comprise a molding compound, epoxy, or the like. The encapsulant 114 may further comprise fillers, such as, silica, or the like. In embodiments where the underfill 112 is included, the encapsulant 114 may form interfaces with fillets of the underfill 112. In other embodiments, the encapsulant 114 may be a molded underfill, which is disposed between the redistribution structure 108 and the devices 102A/102B, such as, around the contacts 110, the solder 106, and the device connectors 104. In such embodiments, and the underfill 112 is omitted and replaced with the encapsulant 114. Further, although FIG. 1A illustrates the encapsulant 114 exposing top surfaces of the devices 102A and 102B, in some embodiments, the devices 102A and 102B may be covered by the encapsulant 114. In embodiments where the devices 102A and 102B are exposed, improved heat dissipation of heat from the devices 102A and/or 102B may be achieved.

The devices 102A and 102B may be bonded to the redistribution structure 108 such that device 102A is physically separated from device 102B by a distance D1 (see FIGS. 1B and 1C). Distance D1 may be measured along a line parallel to a major surface of the redistribution structure 108 (e.g., a top or bottom surface of the redistribution structure 108 as illustrated in FIGS. 1B and 1C). In some embodiments, the distance D1 is selected to account for device size variance and to reduce stress applied to conductive traces of the redistribution structure 108 disposed directly below an area between the devices 102A and 102B. In embodiments accounting for these factors, the distance D1 may be in the range of 50 µm to 300 µm.

Redistribution structure 108 includes a plurality of redistribution layers (sometimes referred to as redistribution lines) 116A, 116B, and 116C, each comprising conductive traces. Redistribution layers 116A, 116B, and 116C may comprise any suitable metal, such as, copper, aluminum, or the like. In the orientation of FIG. 1A, redistribution layer 116C is disposed over redistribution layer 116B, which is further disposed over redistribution layer 116A. For example, redistribution layer 116C is disposed closest to the devices 102A and 102B, and redistribution layer 116A is disposed farthest from the devices 102A and 102B. Although three redistribution layers 116A, 116B, and 116C are illustrated in redistribution structure 108; it is understood that redistribution structure 108 may comprise any number of redistribution layers.

The redistribution layers 116A, 116B, and 116C may each have conductive traces having widths of about 2 µm or less, and a spacing between conductive traces of the redistribution layers 116A, 116B, and 116C may be about 2 µm or less. In various embodiments, a width of a conductive trace may be used to refer to a distance between opposing sidewalls of the conductive trace in a top down view. Conductive traces of these dimensions/spacing may be referred to as "fine pitch." In some embodiments, the redistribution layers 116A, 116B, and 116C may each have conductive traces having widths not less than 1 µm, and a spacing between conductive traces of the redistribution layers 116A, 116B, and 116C may be not less than 1 µm.

Further, a thickness of each of the redistribution layers 116A, 116B, and 116C may be in the range of 1 µm to 5 µm. In various embodiments, a thickness of a conductive trace may be used to refer to a distance between top and bottom surfaces of the conductive trace in a cross sectional view. In some embodiments, the redistribution layers 116A, 116B, and 116C may each have a same thickness, a same width, and/or a same spacing between conductive traces as other redistribution layers in the redistribution structure 108. In other embodiments, one or more of the redistribution layers 116A, 116B, and 116C may have a different (e.g., larger) thickness, width, and/or spacing. For example, in some embodiments, redistribution layers 116A and 116C may be signal layers providing routing of signals to/from the devices 102A and 102B, and redistribution layers 116A and 116C include fine pitched conductive traces for increased routing density. Further, in some embodiments, the redistribution layer 116B may provide power and/or ground lines, which include conductive traces with a larger thickness, width, and/or spacing than the conductive traces of redistribution layers 116A and 116C. In such embodiments, the relatively thick conductive traces of redistribution layer 116B may further provide electromagnetic (EM) shielding and reduce interference between the signal lines of redistribution layers 116A and 116C. For example, in such embodiments, the redistribution layers 116B may have a thickness in the range of 4 µm to 5 µm in order to provide adequate EM shielding between fine-pitched redistribution layers 116A and 116C (e.g., having thicknesses of 2 µm or less). EM shielding can be achieved by the redistribution layer 116B because it is disposed between the redistribution layers 116A and 116C. Other dimensions and configurations of redistribution layers are also contemplated in other embodiments.

Redistribution layers 116A, 116B, and 116C are electrically interconnected by conductive vias 120B, 120C, and 120D. Specifically, the conductive vias 120B extend from and electrically connect the redistribution layer 116A to the redistribution layer 116B; the conductive vias 120C extend from and electrically connect the redistribution layer 116B to the redistribution layer 116C; and conductive vias 120D extend from and electrically connect the redistribution layer 116C to the contacts 110. The redistribution structure further includes conductive vias 120A and 120E, which extend from and electrically connect the redistribution layer 120A to conductive connectors 122.

The conductive connectors 122 are disposed on an opposing side of the redistribution structure 108 as the devices 102A and 102B. The redistribution layers 116A, 116B, and 116C along with the conductive vias 120A, 120B, 120C, 120D, and 120E electrically connect the devices 102A and 102B to the conductive connectors 122. The conductive connectors 122 may be BGA connectors, solder balls, solder caps, metal pillars, C4 bumps, micro bumps, electroless nickel-electroless palladium-immersion gold technique (ENEPIG) formed bumps, or the like. The conductive connectors 122 may include a conductive material such as solder, copper, aluminum, gold, nickel, silver, palladium, tin, the like, or a combination thereof. In some embodiments, the conductive connectors 122 include a copper layer, a nickel layer on the copper layer, and a solder layer on the nickel layer. Other configurations for the conductive connectors 122 may be used.

The conductive connectors 122 include functional connectors 122A. The functional connectors 122A may be used to electrically connect the package 100 to another electronic component (e.g., package substrate 410, see FIG. 4K), such as, another device, a package substrate, an interposer, a motherboard, or the like. In various embodiments, the functional connectors 122A are electrically connected to the devices 102A and 102B by electronic components of the redistribution structure 108. Specifically, the functional connectors 122A are electrically connected to redistribution layer 116A by conductive via 120A and 120E. The conductive vias 120A and 120E are stacked in some embodiments. For example, a longitudinal axis extending through a center of the conductive via 120A also extends through a center of the conductive via 120E. In some embodiments, due to the processes used to form the vias 120A and 120E (as described in greater detail below), the conductive vias 120A and 120E may each have a truncated cone shape, with a smaller diameter of each the truncated cone shaped vias disposed at an interface between the conductive vias 120A and 120E. For example, a diameter of the conductive via 120A increases in a direction away from the conductive via 120E towards the redistribution layer 116A, and a diameter of the conductive via 120E increases in a direction away from the conductive via 120A towards the connectors 122.

Figure 2A:
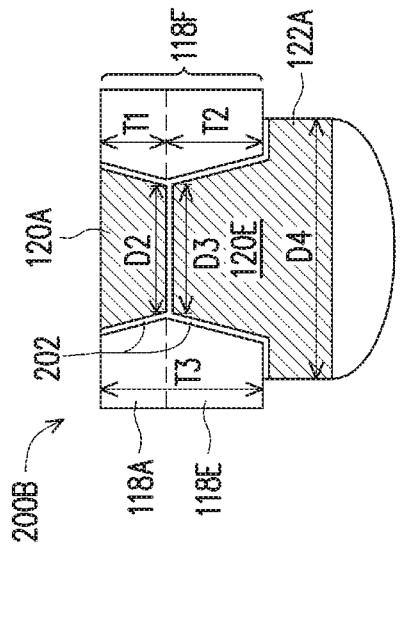
Figure 2B:
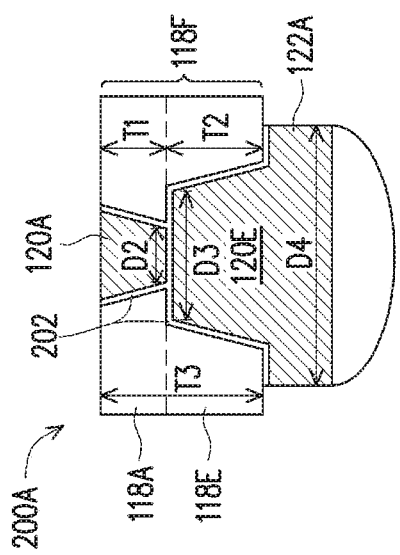
Figure 2C:
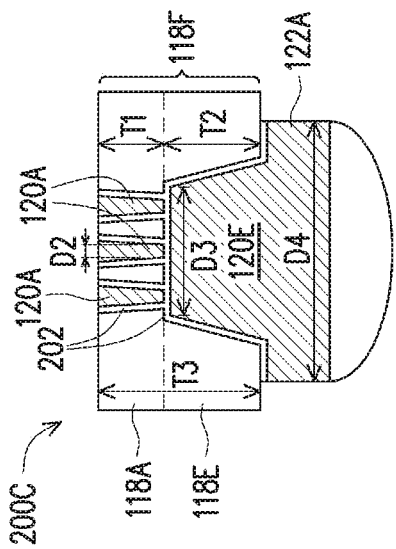

FIGS. 2A, 2B, and 2C illustrate detailed views of a functional connector 122A, conductive via 120A, and conductive via 120E (e.g., in area 200 of FIG. 1A). FIGS. 2A, 2B, and 2C illustrate three possible configurations 200A, 200B, and 200C, respectively, of vias 120A and 120E, which electrically connect the functional connector 122A to redistribution layer 116A.

The conductive vias 120A and 120E include one or more seed layers 202 disposed at an interface between the conductive vias 120A and 120E. The seed layers 202 may further be disposed along the sidewalls and lateral surfaces of the conductive vias 120A and 120E. In some embodiments, the seed layers 202 each comprise one or more conductive materials, such as a copper layer disposed on a titanium layer.

As discussed above, the conductive vias 120A and 120E may each have a truncated cone shape with a smaller diameter of a respective truncated cone disposed at an interface between the conductive vias 120A and 120E. Specifically, conductive via 120A has a diameter D2 at the interface between conductive vias 120A and 120B, and conductive via 120E has a diameter D3 at the interface between the conductive vias 120A and 120B. The diameter D2 is less than (e.g., as illustrated in FIG. 2A) or equal (e.g., as illustrated in FIGS. 2B and 2C) to the diameter D3 in some embodiments. In an embodiment, the diameter D2 may be in the range of about 5 μm to 45 μm and the diameter D3 may be in the range of 25 μm to 60 μm. For example, in FIG. 2A, the diameter D2 may be in the range of 25 μm to 45 μm, and the diameter D3 may be 45 μm. As another example, in FIG. 2B, the diameters D2 and D3 may each be 45 μm. In an embodiment, a ratio of the diameter D2 to the diameter D3 may be in the range of 0.2 to 1.0. Further, in some embodiments (as illustrated in FIG. 2C), a single conductive via 120E may be connected to a plurality of physically separated conductive vias 120A. In some embodiments, the conductive vias 120A and 120E are circular in a top down view. In such embodiments when the conductive vias 120A and 120E are circular, stress concentration can be reduced at the interface between the conductive vias 120A and 120E. In other embodiments, the conductive vias 120A and 120E may have different dimensions, shapes, and/or configurations. For example, one or more of the conductive vias 120A and 120E may have an oval, rectangular, or other polygon shape in a top down view.

As described in greater detail below, the conductive vias 120E may be formed simultaneously with the conductive connectors 122 such that no interface is disposed between the conductive vias 120E and the conductive connectors 122. In some embodiments, a diameter D4 of the conductive connectors 122 is greater than the diameter D2 of the conductive via 120E. For example, a ratio of the diameter D4 to the diameter D2 may be in the range of 4:1 to 5:1. In some embodiments, the conductive connectors 122 have each may have an oval shape in a top down view. In such embodiments when the conductive connectors 122 are ovals, the diameter D4 may refer to a dimension of the minor axis of the oval. In another embodiment, each of the conductive connectors 122 has a circular shape in a top down view, which may reduce or prevent stress at interfaces between the conductive vias 120E and the conductive connectors 122. In other embodiments, each of the conductive connectors 122 has a different shape, such as a rectangle or other polygon.

Referring back to FIG. 1A, the conductive connectors 122 may further include dummy connectors 122B in some embodiments. The dummy connectors 122B are disposed adjacent the functional connectors 122A. The dummy connectors 122B may be used to reduce stress on the functional connectors 122A and to improve capillary flow during the application of an underfill between the redistribution structure 108 and another electronic component bonded to the redistribution structure 108 by the connectors 122. The dummy connectors 122B may not provide any electronic functionality. For example, the dummy connectors 122B may be electrically isolated from devices 102A and 102B.

Because the dummy connectors 122B are electrically isolated from the devices 102A and 102B, the dummy connectors may not be physically connected to any redistribution layers of the redistribution structure 108 by any conductive features. As such, the dummy connectors 122B may have a weaker adhesion to dielectric layers of the redistribution structure 108 (e.g., dielectric layers 118A and 118E, described in greater detail below). To address adhesion issues, in some embodiments, the dummy connectors 122B may be mechanically coupled to conductive vias 120E, which help to embed the dummy connectors 122B in the dielectric layer 118E for improved adhesion.

Figure 3:
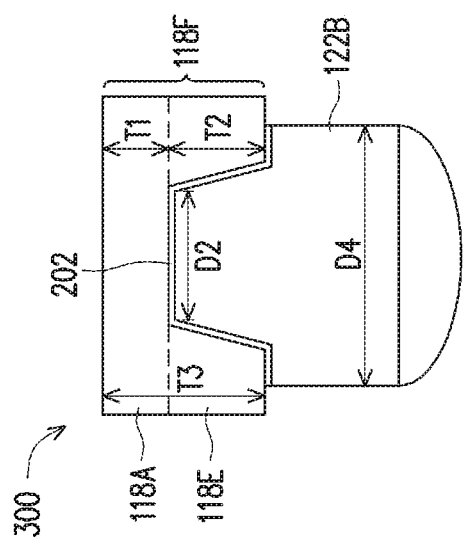

FIG. 3 illustrates a detailed view of a dummy connector 122B and a conductive via 120E (e.g., in area 300 of FIG. 1A). The conductive via 120E includes one or more seed layers 202 disposed at an interface between the conductive via 120E and dielectric layers 118A/118E. For example, the seed layers 202 may be disposed along the sidewalls and lateral surfaces of the conductive via 120E. In some embodiments, the seed layers 202 comprise one or more conductive materials, such as a copper layer disposed on a titanium layer.

The conductive via 120E may not physically or electrically connect the dummy connector 122B to any other conductive features (e.g., conductive vias 120A or redistribution layers) in the redistribution structure 108. For example, dielectric layer 118F may continuously cover an entire surface of the conductive via 120E opposite the dummy connector 122B. As such, the inclusion of conductive vias 120E connected to dummy connectors 122B may not affect routing space within the redistribution structure 108 (e.g., spacing of conductive vias 120A or redistribution layer 116A). For example, because redistribution layer 116A may include fine pitched conductive traces, areas around the fine pitched conductive traces in immediately adjacent polymer layers (e.g., dielectric layer 118A) may be forbidden zones from a design rule point of view, and conductive vias may be forbidden in these zones. As such, by only including conductive vias 120E in dielectric layer 118E, the dummy connectors 122B may be anchored without violating any design rules. The conductive vias 120E connected to the dummy connectors 122B may be formed concurrently with and have a same size and configuration as conductive vias 120E connected to the functional connectors 122A (see FIGS. 1A, 2A, 2B, and 2C). In other embodiments, the dummy connectors 122B are not mechanically or electrically connected to any conductive vias in the redistribution structure 108.

The conductive vias 120A, 120B, 120C, 120D, and 120E are formed in openings in a respective dielectric layer 118A, 118B, 118C, 118D, and 118E in which the conductive vias 120A, 120B, 120C, 120D, and 120E extend through. The conductive vias 120A, 120B, 120C, 120D, and 120E may comprise any conductive material, such as copper, or the like. In some embodiments, one or more of the conductive vias 120A, 120B, 120C, 120D, and 120E may be conformal in the openings such that a thickness of the conductive vias along a sidewall of a respective dielectric layers is substantially equal to a thickness of lateral portions of the conductive vias (see e.g., the conductive vias 120B, 120C, and 120D of FIG. 1B). In other embodiments, one or more the conductive vias 120A, 120B, 120C, 120D, and 120E may be non-conformal, and a thickness of the conductive vias 120A, 120B, 120C, 120D, and 120E along a sidewall of a respective dielectric layer may be different than a thickness of lateral portions of the conductive vias. In some embodiments, the conductive vias 120A, 120B, 120C, 120D, and 120E may each fill at least 50% of a respective opening in which the conductive via is disposed. In some embodiments, the conductive vias 120A, 120B, 120C, 120D, and 120E may be filled vias and completely fill a respective opening in which the conductive via is disposed (see e.g., the conductive vias 120A, 120B, 120C, 120D, and 120E of FIG. 1C).

Each of the conductive vias 120A, 120B, 120C, 120D, and 120E may or may not be stacked with other conductive vias 120A, 120B, 120C, 120D, and 120E disposed above and/or below a respective conductive via 120A, 120B, 120C, 120D, and 120E. FIG. 1B illustrate conductive vias 120A, 120B, 120C, 120D, and 120E, which are not stacked while FIG. 1C illustrate stacked conductive vias 120A, 120B, 120C, 120D, and 120E (denoted as stacked vias 120F). The stacked vias 120F may include any number of a plurality of conductive vias 120A, 120B, 120C, 120D, and 120E. For example, in FIG. 1C, the first stacked vias 120F includes conductive vias 120B and 120C; second stacked vias 120F include conductive vias 120A, 120B, 120C, and 120E; and third stacked vias 120F include conductive vias 120B, 120C, and 120D. These configurations are meant to be non-limiting and other configurations of stacked vias may also be used. In some embodiments, a longitudinal axis of stacked vias 120F extends through a center of each of the conductive vias 120A, 120B, 120C, 120D, and/or 120E part of the stacked vias 120F. In some embodiments, conductive vias which are not stacked each have a longitudinal axis which is offset from a respective longitudinal axis of other conductive vias above and/or below the conductive vias. Although stacked vias 120F are illustrated as being filled vias, in other embodiments, one or more of the plurality of vias of the stacked 120F may be conformal vias.

Redistribution structure 108 further includes dielectric layers 118A, 118B, 118C, 118D, and 118E in which the redistribution layers 116A, 116B, and 116C and the conductive vias 120A, 120B, 120C, 120D, and 120E are disposed. As will be described in greater detail below, in some embodiments, the dielectric layers 118A, 118B, 118C, and 118D are successively formed prior to bonding the devices dies 102A and 102B to the redistribution structure 108. As such, a thermal budget of dielectric layers 118A, 118B, 118C, and 118D may be relatively large because there is no concern of high temperature curing processes for dielectric layers 118A, 118B, 118C, and 118D negatively affecting device performance of devices 102A or 102B. Thus, there may be minimal curing temperature considerations for the dielectric layers 118A, 118B, 118C, and 118D, and the dielectric layers 118A, 118B, 118C, and 118D may each comprise a polymer, such as, polybenzoxazole (PBO), benzocyclobutene (BCB), a high curing temperature polyimide (e.g., having a curing temperature greater than 170° C.), a low curing temperature polyimide (e.g., a curing temperature less than 170° C.), or the like. Each of the dielectric layers 118A, 118B, 118C, and 118E may have a thickness in a range of 2 µm to 7 µm.

In some embodiments, a stress buffer layer 118F includes dielectric layers 118A and 118E and is used to mitigate stress between the conductive connectors 122 and the redistribution layer 116A. Stress mitigation may be particularly beneficial in embodiments where the redistribution layer 116A includes fine pitched traces (e.g., having a pitch of 2 µm or less) and is used for high-density signal routing. As shown in FIGS. 2A, 2B and 2C, the stress buffer layer 118F has a thickness T3, which is a combined thickness of dielectric layer 118A (having a thickness T1) and dielectric layer 118E (having a thickness T2). In some embodiments, thickness T3 of the stress buffer layer 118F is in the range of 5 µm to 25 µm. In some embodiments, thickness T3 of the stress buffer layer 118F is at least 15 µm when the redistribution layer 116A in FIGS. 1A, 1B and 1C has a pitch of 2 µm or less in order to provide sufficient stress relief between the conductive connectors 122 and the redistribution layer 116A.

Further, thickness T1 of the dielectric layer 118A may or may not be equal to the thickness T2 of dielectric layer 118E. The dielectric layers 118A and 118E may or may not have a same material composition. For example, the dielectric layer 118E may be softer (e.g., have a lower modulus) than the dielectric layer 118A in order to mitigate stress applied by the conductive connectors 122 on the redistribution layers 116A, 116B, and 116C. For example, the dielectric layer 118E may have a modulus in a range of 2 GPa to 4 GPa to mitigate stress applied by the conductive connectors 122. In some embodiments, the dielectric layer 118E is formed after the devices 102A and 102B are bonded to the redistribution structure 108. As such, the dielectric layer 118E may comprise a low-curing temperature polyimide (e.g., having a curing temperature less than 170° C.) in order to prevent damage to devices 102A and 102B. Other materials may also be used for dielectric layer 118E.

FIGS. 4A through 4K illustrate various intermediary process steps of forming a package in accordance with various embodiments. In FIGS. 4A through 4K, various features of the package formed may be similar to those described above with respect to FIGS. 1A, 1B, 1C, 2A, 2B, 2C, and 3 where like reference numbers indicate like elements. The various embodiments described above with respect to elements of FIGS. 1A, 1B, 1C, 2A, 2B, 2C, and 3 are applicable to FIGS. 4A through 4K and are not repeated herein for brevity.

Figure 4A:
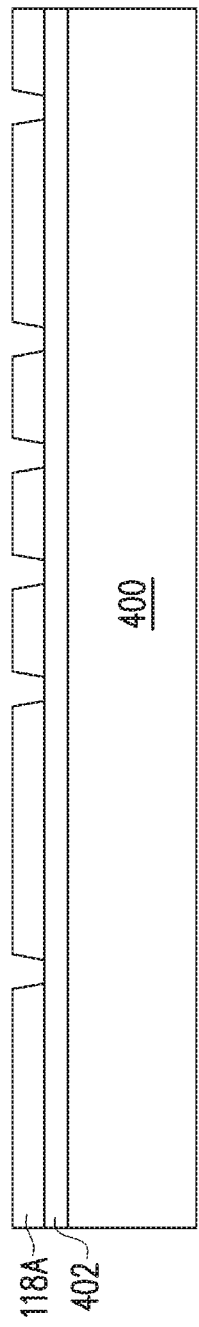

FIG. 4A illustrates a cross-sectional view of a carrier substrate 400 and a release layer 402 formed on the carrier substrate 400. A single package region is illustrated in FIG. 4A, but multiple package regions may be disposed over the carrier substrate 400 such that multiple packages can be formed simultaneously over the carrier substrate 400, and a subsequent singulation process is applied to separate each of the multiple packages.

The carrier substrate 400 may be a glass carrier substrate, a ceramic carrier substrate, or the like. The carrier substrate 400 may be a wafer, such that multiple packages can be formed on the carrier substrate 400 simultaneously. The release layer 402 may be formed of a polymer-based material, which may be removed along with the carrier substrate 400 from the overlying structures that will be formed in subsequent steps. In some embodiments, the release layer 402 is an epoxy-based thermal-release material, which loses its adhesive property when heated, such as a light-to-heat-conversion (LTHC) release coating. In other embodiments, the release layer 102 may be an ultra-violet (UV) glue, which loses its adhesive property when exposed to UV lights. The release layer 402 may be dispensed as a liquid and cured, may be a laminate film laminated onto the carrier substrate 400, or may be the like. The top surface of the release layer 402 may be leveled and may have a high degree of planarity.

As further illustrated in FIG. 4A, a dielectric layer 118A is deposited and patterned on the release layer 402. The bottom surface of the dielectric layer 118A may be in contact with the top surface of the release layer 402. In some embodiments, the dielectric layer 118A may be formed by any acceptable deposition process, such as spin coating, chemical vapor deposition (CVD), laminating, the like, or a combination thereof. After deposition, the dielectric layer 118A is then patterned to form openings to expose portions of the immediately underlying layer (e.g., the release layer 402). The patterning may be by an acceptable process, such as by exposing the dielectric layer 118A to light when the dielectric layer is a photo-sensitive material or by etching using, for example, an anisotropic etch. The pattern of openings in the dielectric layer 118A may correspond to a pattern of subsequently formed conductive vias 120A (see FIGS. 1A and 4B).

Figure 4B:
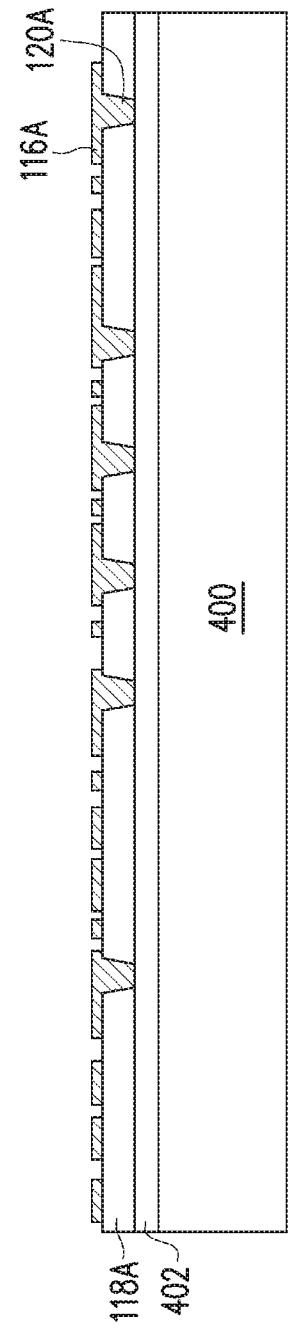

FIG. 4B illustrates the formation of a metallization pattern over the dielectric layer 118A. The metallization pattern includes conductive vias 120A and redistribution layer 116A. As an example to form metallization pattern, a seed layer is formed over the dielectric layer 118A. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. The seed layer may be deposited to extend through openings in the dielectric layer 118A. A photo resist is then formed and patterned on the seed layer. The photo resist may be formed by spin coating or the like and may be exposed to light for patterning. The pattern of the photo resist corresponds to the redistribution layer 116A. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern (including the conductive vias 120A and the redistribution layer 116A).

Figure 4C:
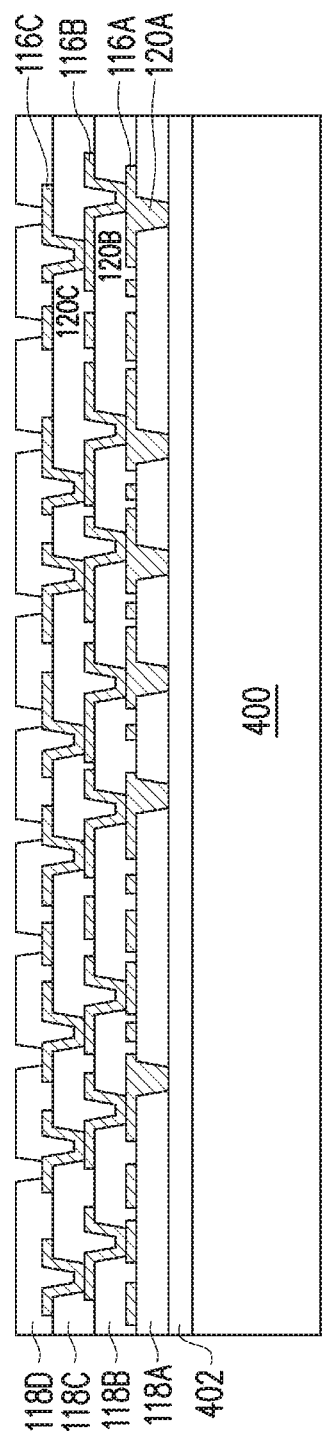

FIG. 4C illustrate the formation of dielectric layers 118B, 118C, and 118D; redistribution layers 116B and 116C, and conductive vias 120B and 120C over the dielectric layer 118A and the redistribution layer 116A. The deposition and patterning of the dielectric layers 118B, 118C, and 118D may be performed using a similar process described with respect to dielectric layer 118A. The formation of conductive vias 120B and 120C may be performed using a similar process described with respect to conductive via 120A, and the formation of redistribution layers 116B and 116C may be performed using a similar process described with respect to redistribution layer 116A. One or more of the conductive vias 120A, 120B, and 120C may or may not completely fill openings in a corresponding dielectric layer 118A, 118B, and 118D. The amount a conductive via fills openings in a corresponding dielectric layer may be controlled, for example, by controlling parameters (e.g., the chemistry) of the plating process used to form the conductive vias. Openings are patterned in the dielectric layer 118D to expose portions of the redistribution layer 116C.

Figure 4D:
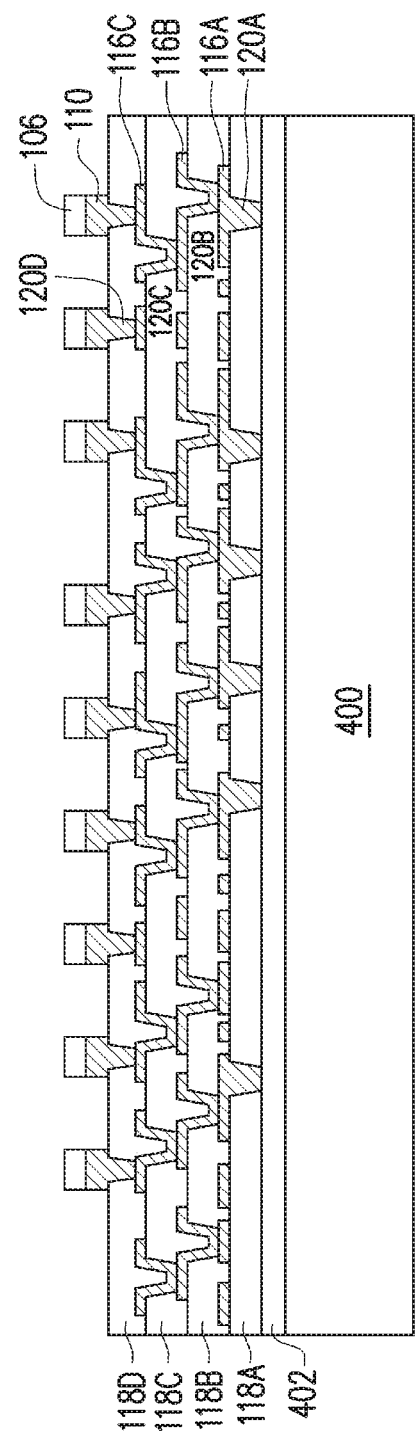

In FIG. 4D, contacts 110 are formed over and through the dielectric layer 116C. The contacts 110 are electrically connected to the redistribution layer 116C, and the formation of contacts 110 may be performed using a similar process described with respect to redistribution layer 116A and conductive vias 120. As further illustrated by FIG. 4D, solder 106 may be optionally formed on the contacts 110 through methods such as evaporation, electroplating, printing, solder transfer, ball placement, or the like. In other embodiments, solder 106 may be omitted from being formed on contacts 110 prior to bonding devices 102A and 102B (see FIG. 4E). For example, prior to bonding, solder 106 may only be formed on device connectors 104 of devices 102A and 102B (see FIG. 4E).

Figure 4E:
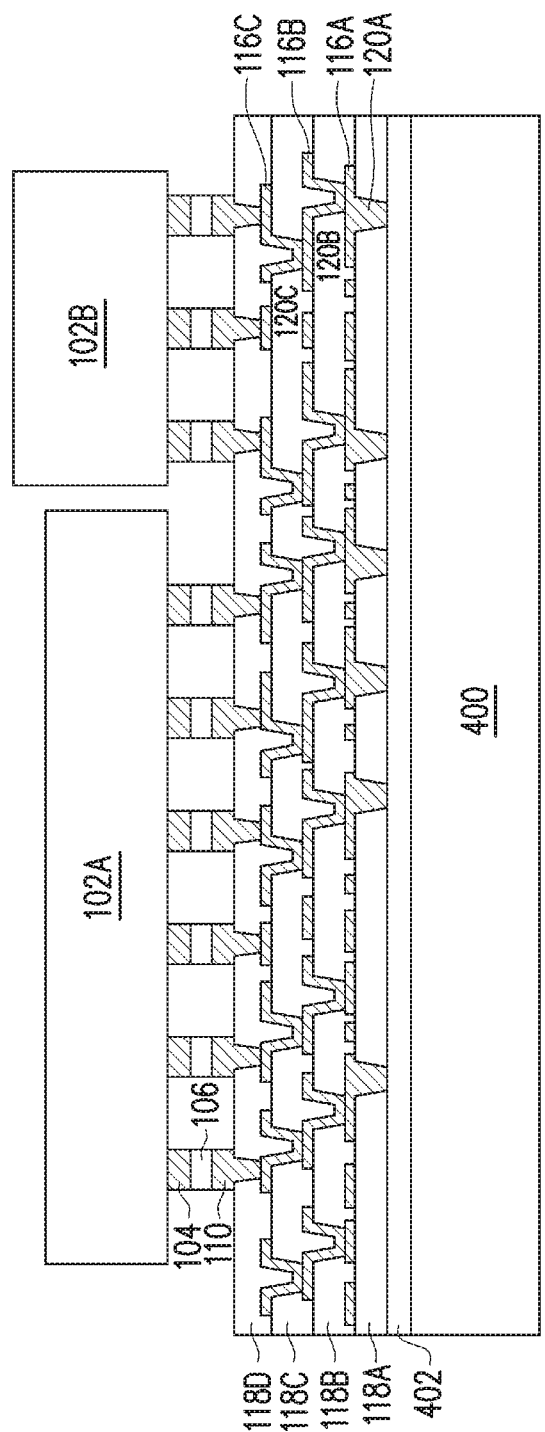

In FIG. 4E, devices 102A and 102B are bonded (e.g., flip chip bonded) to contacts 110. The devices 102A and 102B are electrically connected to the redistribution layers 116A, 116B, and 116C, which may provide signal routing (e.g., between the devices 102A and 102B), power lines, ground lines, combinations thereof, or the like. Bonding the devices 102A and 102B may include bonding contacts 110 to device connectors 104 of devices 102A and 102B using solder 106. In various embodiments, a portion of solder 106 may or may not be disposed on contacts 104 prior to bonding the devices 102A and 102B.

Figure 4F:
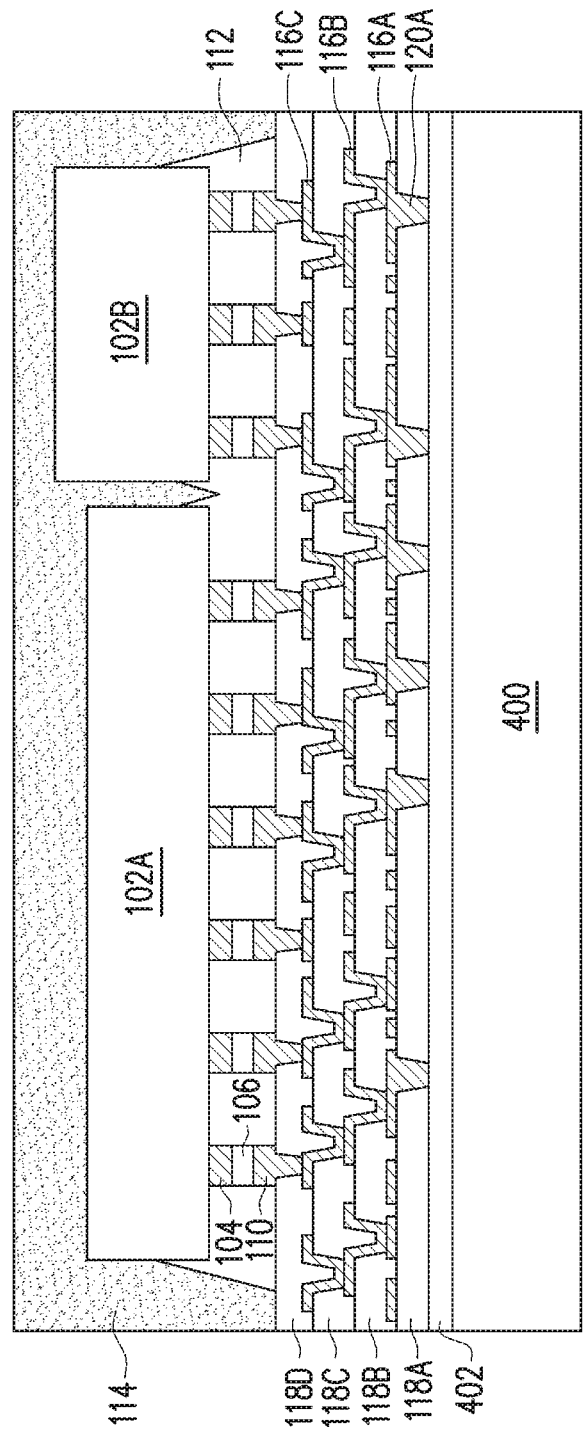
Figure 4G:
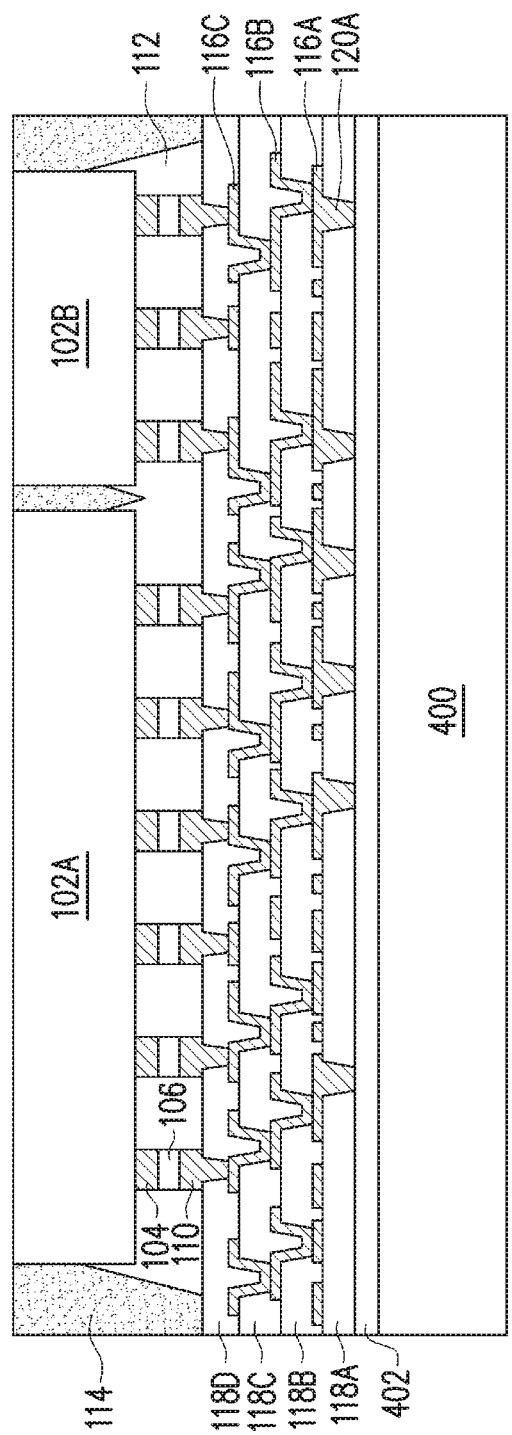
Figure 41:
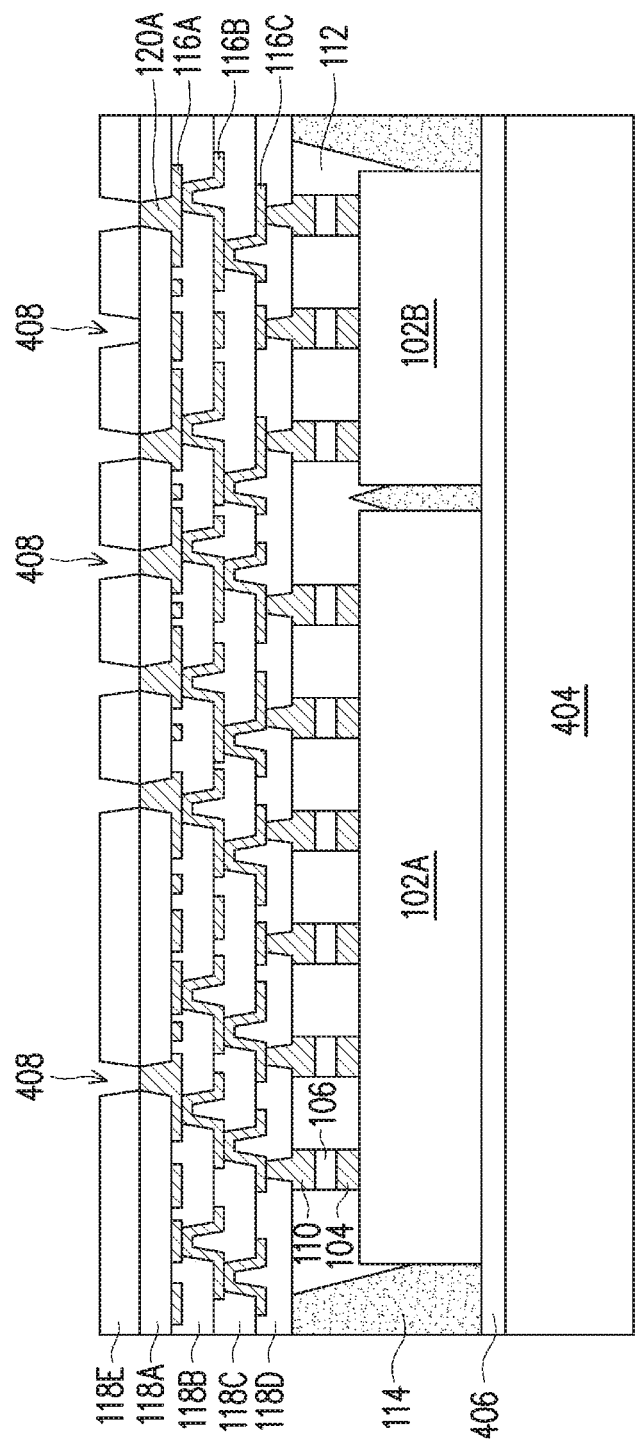

In FIG. 4F, an optional underfill 112 is dispensed between the dielectric layer 118D and the devices 102A and 102B. The underfill 112 may be disposed around the contacts 104, the contacts 110, and the solder 106. The underfill 112 may be formed by a capillary flow process after the devices 102A and 102B are attached or may be formed by a suitable deposition method before the devices 102A and 102B are attached.

As further illustrated by FIG. 4F, an encapsulant 114 is formed on the various components (e.g., around devices 102A and 102B as well as the underfill 112, if present). The encapsulant 114 may be a molding compound, epoxy, or the like, and may be applied by compression molding, transfer molding, or the like. In some embodiments, the encapsulant 114 is a molded underfill, and the underfill 112 may be omitted. The encapsulant 114 may further comprise fillers, such as, silica, or the like. The encapsulant 114 may be dispensed in liquid form around the devices 102A/102B. After the encapsulant 114 is dispensed, a curing process may be performed to harden the encapsulant 114.

After curing, the encapsulant 114 can undergo an optional planarization process (e.g., a mechanical grinding, a chemical mechanical polish (CMP), or the like) to improve a planarity of a top surface of the encapsulant 114. In some embodiments, the planarization process may expose one or more of the devices 102A and 102B (see FIG. 4G). In some embodiments, the planarization process may further planarize one or more of the devices 102A and 102B particularly in embodiments where the devices 102A and 102B have different heights. For example, in FIG. 4G, a height of the device 102B has been reduced compared to FIG. 4F as a result of the planarization process.

In FIG. 4H, a carrier substrate de-bonding is performed to detach (de-bond) the carrier substrate 400 from the redistribution structure, e.g., dielectric layer 118A. In accordance with some embodiments, the de-bonding includes projecting a light such as a laser light or an UV light on the release layer 402 so that the release layer 402 decomposes under the heat of the light and the carrier substrate 400 can be removed. The structure is then flipped over and placed on a different carrier substrate 404 using a different release layer 406. The carrier substrate 404 may be similar to the carrier substrate 400, and the release layer 406 may be similar to the release layer 402.

In FIG. 4I, dielectric layer 118E is deposited and patterned on the dielectric layer 118A. The dielectric layer 118E may or may not be formed a same material as the dielectric layer 118A. In some embodiments, the dielectric layer 118E may be formed by any acceptable deposition process, such as spin coating, CVD, laminating, the like, or a combination thereof. After deposition, the dielectric layer 118E is then patterned to form openings 408 to expose portions of the immediately underlying layer. For example, openings 408 may expose the conductive vias 120A. At least a portion of the openings 408 (e.g., opening 408A) may expose the underlying dielectric layer 118A without exposing any conductive vias. The patterning may be by an acceptable process, such as by exposing the dielectric layer 118E to light when the dielectric layer is a photo-sensitive material or by etching using, for example, an anisotropic etch.

The pattern of openings 408 in the dielectric layer 118E may correspond to a pattern of subsequently formed conductive vias 120E (see FIGS. 1A and 4J). Furthermore, as a result of the patterning process of the openings 408, a diameter of the openings 408 may continuously decrease in a direction towards the dielectric layer 118A/conductive vias 120A. A diameter of the conductive vias 120A may likewise continuously decrease towards the dielectric layer 118E/openings 408 (e.g., as a result of the patterning process described with respect to FIG. 4A).

Figure 4J:
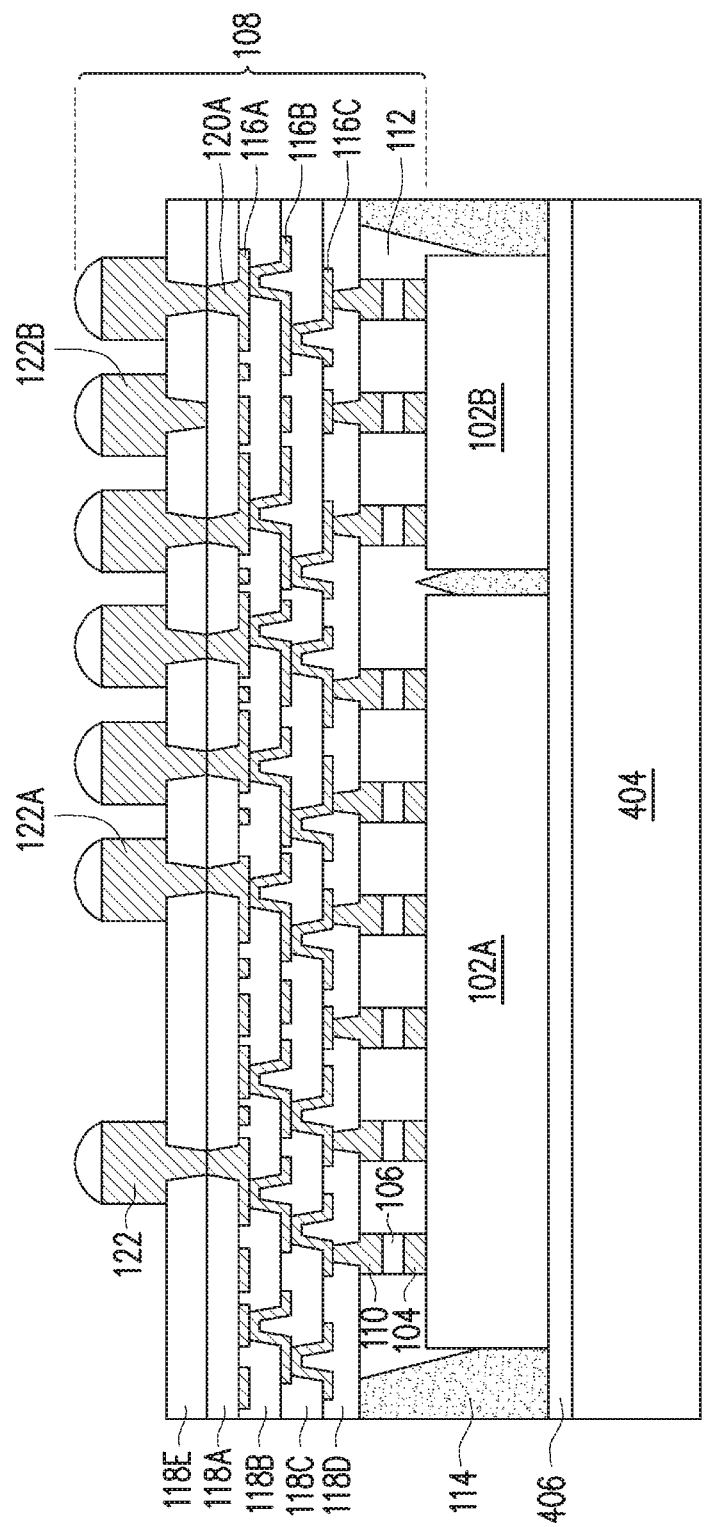

FIG. 4J illustrates the formation of a metallization pattern over the dielectric layer 118E. The metallization pattern includes conductive vias 120E and conductive connectors 122. The conductive connectors 122 include functional connectors 122A and optionally dummy connectors 122B. As an example to form metallization pattern, a seed layer is formed over the dielectric layer 118E. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. The seed layer may be deposited to extend through openings in the dielectric layer 118E. A photo resist is then formed and patterned on the seed layer. The photo resist may be formed by spin coating or the like and may be exposed to light for patterning. The pattern of the photo resist corresponds to the conductive connectors 122. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern (including the conductive vias 120E and the conductive connectors 122). Subsequently, solder regions may be formed on the conductive connectors 122 through methods such as evaporation, electroplating, printing, solder transfer, ball placement, or the like. Thus, a redistribution structure 108 according to an embodiment may be formed using the processes described above in FIGS. 4A through 4J.

Figure 4K:
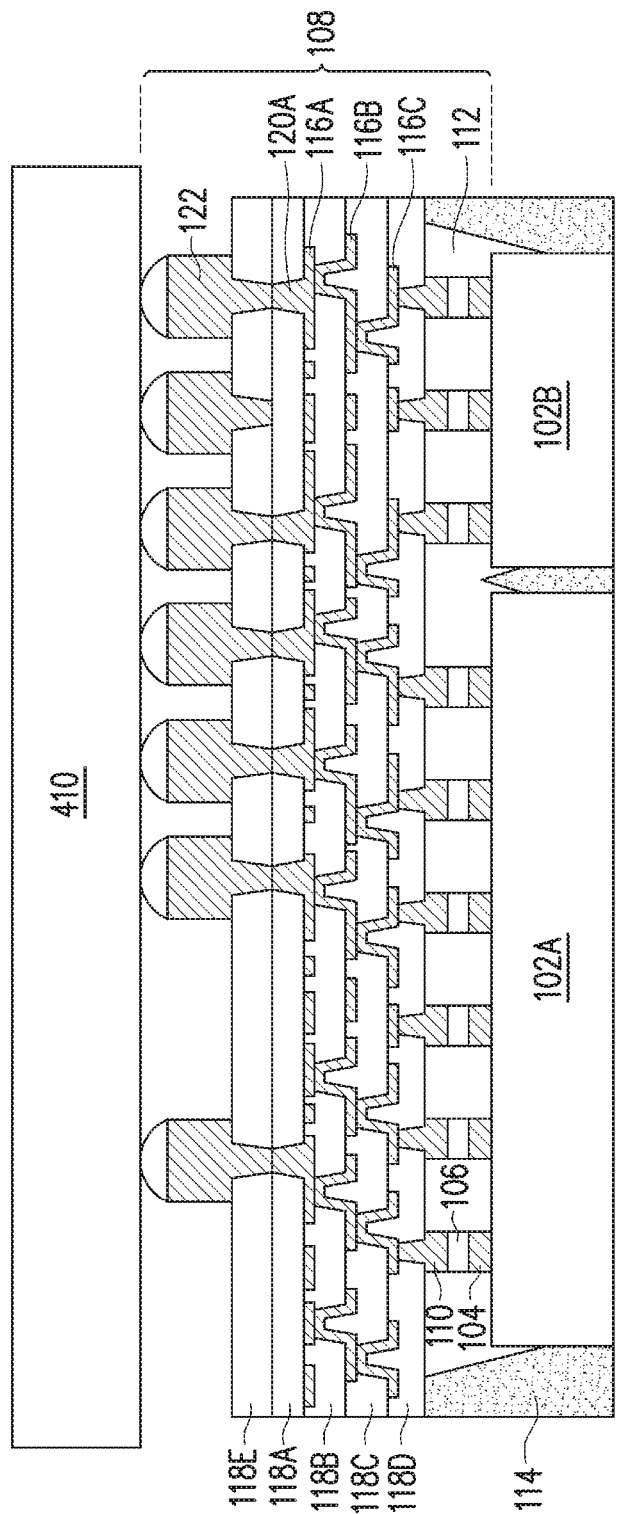

In FIG. 4K, a carrier substrate de-bonding is performed to detach (de-bond) the carrier substrate 404 from the redistribution structure 108 and the devices 102A and 102B. In accordance with some embodiments, the de-bonding includes projecting a light such as a laser light or an UV light on the release layer 406 so that the release layer 406 decomposes under the heat of the light and the carrier substrate 404 can be removed. A singulation process is then performed by sawing along scribe line regions e.g., between adjacent package regions. The sawing singulates the package including devices 102A and 102B from other packages formed on the carrier substrates 400 and 404.

FIG. 4K further illustrates the bonding of a substrate 410 to the redistribution structure 108 using the conductive connectors 122. The package substrate 410 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 410 may be a SOI substrate. Generally, an SOI substrate includes a layer of a semiconductor material such as epitaxial silicon, germanium, silicon germanium, SOI, SGOI, or combinations thereof. The package substrate 410 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 410.

The package substrate 410 may include active and passive devices. As one of ordinary skill in the art will recognize, a wide variety of devices such as transistors, capacitors, resistors, combinations of these, and the like may be used to generate the structural and functional requirements of the design for the semiconductor package. The devices may be formed using any suitable methods.

The package substrate 410 may also include metallization layers and vias and bond pads over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 410 is substantially free of active and passive devices.

In some embodiments, the conductive connectors 122 can be reflowed to attach the redistribution structure 108 to the bond pads of the package substrate 410. The conductive connectors 122 electrically and/or physically couple the substrate 410, including metallization layers in the substrate 410, to the redistribution structure 108, which in turn electrically couples the substrate 410 to the devices 102A and 102B. In some embodiments, passive devices (e.g., surface mount devices (SMDs)) may be bonded to a same surface of the package substrate 410 as the conductive connectors 122.

The conductive connectors 122 may have an epoxy flux (not shown) formed thereon before they are reflowed with at least some of the epoxy portion of the epoxy flux remaining after the redistribution structure 108 is attached to the substrate 410. This remaining epoxy portion may act as an underfill to reduce stress and protect the joints resulting from the reflowing the conductive connectors 122. In some embodiments, an underfill may be formed between the redistribution structure 108 and the substrate 410 and surrounding the conductive connectors 122. The underfill may be formed by a capillary flow process after the redistribution structure 108 is attached or may be formed by a suitable deposition method before the redistribution structure 108 is attached.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 5A:
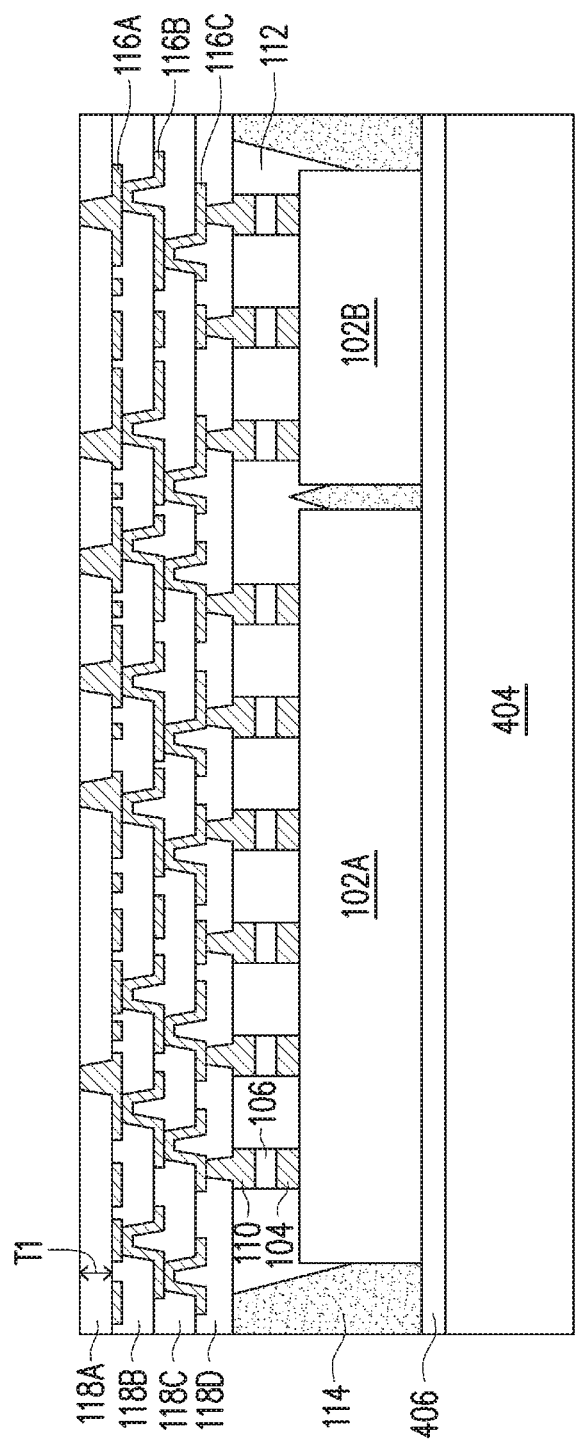
FIGS. 5A and 5B illustrate cross-sectional views of various intermediary steps of forming a semiconductor package in accordance with some alternative embodiments.
Figure 5B:
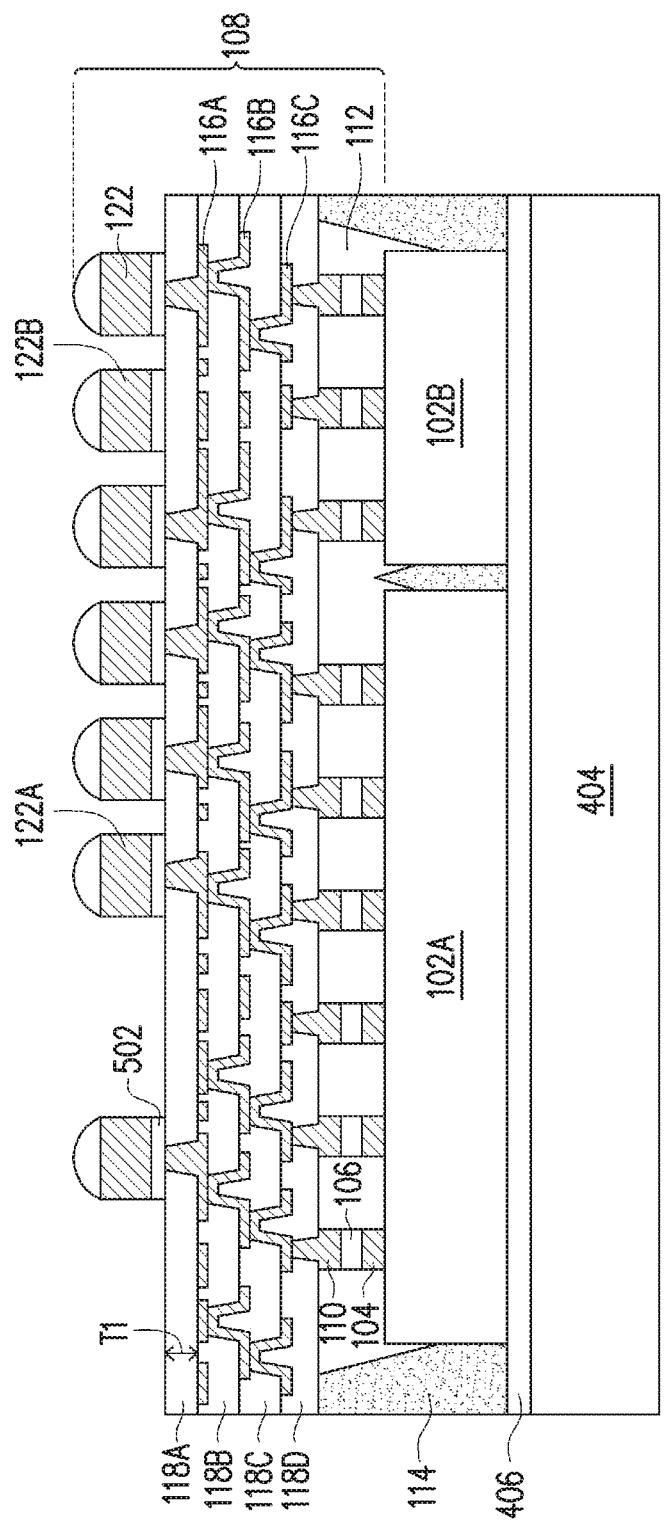

FIGS. 5A and 5B illustrate intermediary process steps of forming a redistribution structure 108 according to other embodiments. In FIGS. 5A and 5B, the dielectric layer 118E is omitted, and the dielectric layer 118A is used as a stress buffer layer to mitigate stress between conductive connectors 122 (see FIG. 5B) and redistribution layers 116A, 116B, and 116C. As such, a thickness T1 of the dielectric layer 118A may be greater than respective thicknesses of the dielectric layers 118B, 118C, and 118D. For example, a thickness of each of the dielectric layers 118B, 118C, and 118D may be in the range of 5 μm to 7 μm while a thickness T1 of the dielectric layer 118A may be in the range of 5 μm to 45 μm. In some embodiments, thickness T1 of the dielectric layer 118A is at least 15 μm when the redistribution layer 116A has a pitch of 2 μm or less in order to provide sufficient stress relief between the conductive connectors 122 and the redistribution layer 116A. By providing a thicker dielectric layer 118A, stress buffering may be achieved without including the dielectric layer 118E.

FIG. 5A illustrates an intermediary formation step after devices 102A and 102B are bonded to contacts 110 and the dielectric layer 118A is exposed. The various process steps to form features illustrated in FIG. 5A are described above in FIGS. 1A, 1B, 1C, 2A, 2B, 2C, 3, and 4A through 4H where like reference numerals indicate like elements formed using like processes.

In FIG. 5B, conductive connectors 122 are formed over the dielectric layer 118A. The conductive connectors 122 include functional connectors 122A and optionally dummy connectors 122B. As an example to form the conductive connectors 122, a seed layer 502 is formed over the dielectric layer 118A. In some embodiments, the seed layer 502 is a metal layer, which may be a single layer or a composite layer comprising a plurality of sub-layers formed of different materials. In some embodiments, the seed layer 502 comprises a titanium layer and a copper layer over the titanium layer. The seed layer 502 may be formed using, for example, PVD or the like. A photo resist is then formed and patterned on the seed layer 502. The photo resist may be formed by spin coating or the like and may be exposed to light for patterning. The pattern of the photo resist corresponds to the conductive connectors 122. The patterning forms openings through the photo resist to expose the seed layer 502. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the conductive connectors 122. Subsequently, solder regions may be formed on the conductive connectors 122 through methods such as evaporation, electroplating, printing, solder transfer, ball placement, or the like. Thus, a redistribution structure 108 according to an embodiment may be formed. Subsequent processing steps may be applied, for example, as described above with respect to FIG. 4K to bond a package substrate to the redistribution structure 108.

Figure 6A:
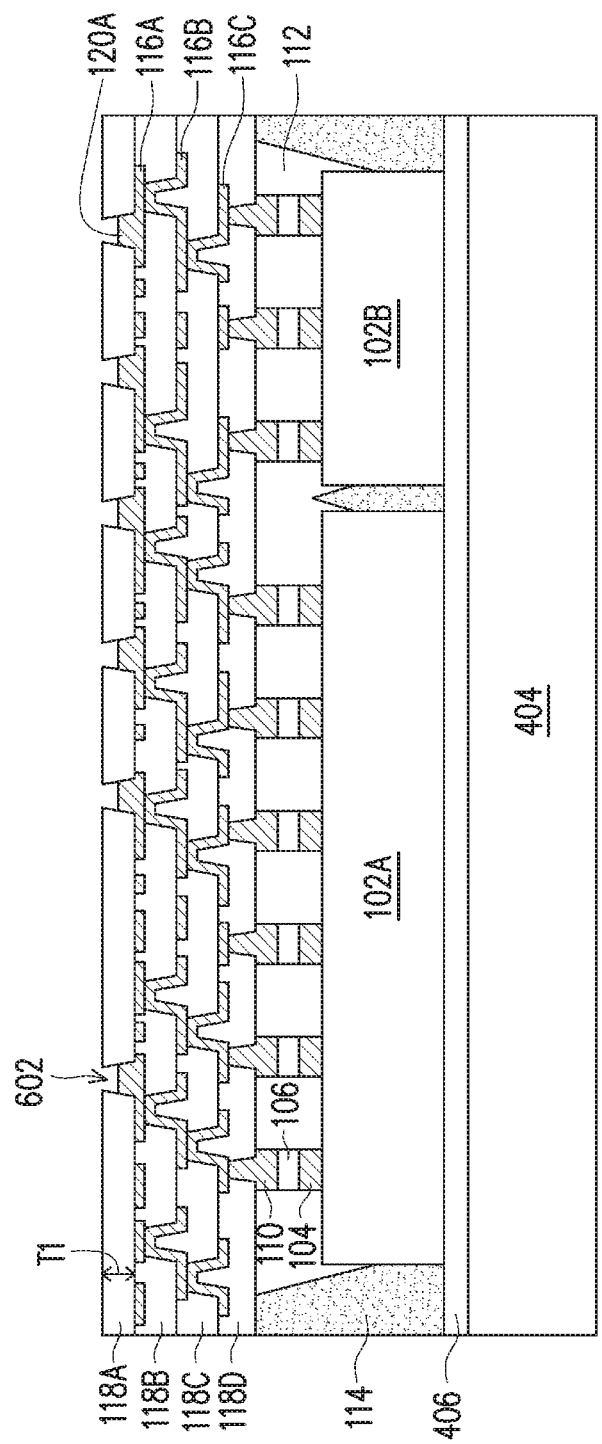
FIGS. 6A and 6B illustrate cross-sectional views of various intermediary steps of forming a semiconductor package in accordance with some alternative embodiments.
Figure 6B:
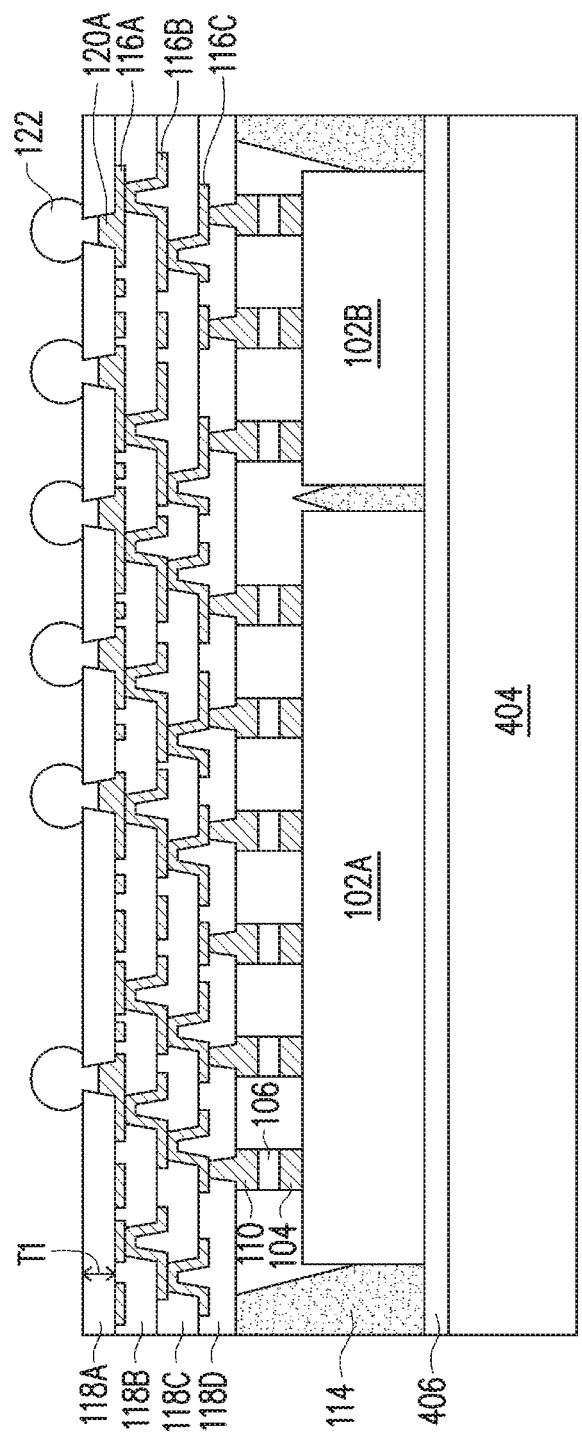

FIGS. 6A and 6B illustrate intermediary process steps of forming a redistribution structure 108 according to other embodiments. In FIGS. 6A and 6B, the dielectric layer 118E may be omitted, and the dielectric layer 118A is used as a stress buffer layer to mitigate stress between conductive connectors 122 (see FIG. 6B) and redistribution layers 116A, 116B, and 116C. As such, a thickness T1 of the dielectric layer 118A may be greater than respective thicknesses of the dielectric layers 118B, 118C, and 118D. For example, a thickness of each of the dielectric layers 118B, 118C, and 118D may be in the range of 5 μm to 7 μm while a thickness T1 of the dielectric layer 118A may be in the range of 5 μm to 45 μm. In some embodiments, thickness T1 of the dielectric layer 118A is at least 15 μm when the redistribution layer 116A has a pitch of 2 μm or less in order to provide sufficient stress relief between the conductive connectors 122 and the redistribution layer 116A. By providing a thicker dielectric layer 118A, stress buffering may be achieved without including the dielectric layer 118E.

FIG. 6A illustrates an intermediary formation step after devices 102A and 102B are bonded to contacts 110 and the dielectric layer 118A is exposed. The various process steps to form features illustrated in FIG. 6A are described above in FIGS. 1A, 1B, 1C, 2A, 2B, 2C, 3, and 4A through 4H where like reference numerals indicate like elements formed using like processes. As further illustrated by FIG. 6A, an etching process is applied to the conductive vias 120A to recess the conductive vias 120A below a top surface of the dielectric layer 118A. Recessing the conductive vias 120A may form openings 602 in the dielectric layer 118A above the conductive vias 120A. In etching process may be a selective etching, which etches the conductive vias 120A at a higher rate than the dielectric layer 118A.

In FIG. 6B, conductive connectors 122 are formed over the dielectric layer 118A. The conductive connectors 122 may include solder regions disposed directly on the redistribution layer 116A without any intermediary UBM features. A portion of the solder regions may extend at least partially into the openings 602 in the dielectric layer 118A. The solder regions may be formed on the redistribution layer 116A through methods such as evaporation, electroplating, printing, solder transfer, ball placement, or the like. Thus, a redistribution structure 108 according to an embodiment may be formed. Subsequent processing steps may be applied, for example, as described above with respect to FIG. 4K to bond a package substrate to the redistribution structure 108.

FIGS. 7A through 7E illustrate various intermediary process steps of forming the conductive vias 120A and the redistribution layer 116A when a thicker dielectric layer 118A is used as a stress buffer layer according to some embodiments. For example, the embodiment processes described with respect to FIGS. 7A through 7E may be used in combination with the embodiments described in FIGS. 5A, 5B, 6A, and 6B. Because a relatively thick dielectric layer 118A is deposited, consideration may be taken into account for the formation of the conductive vias 120A and the redistribution layer 116A in order to provide a sufficiently level topography for a top surface of the redistribution layer 116A.

Figure 7A:
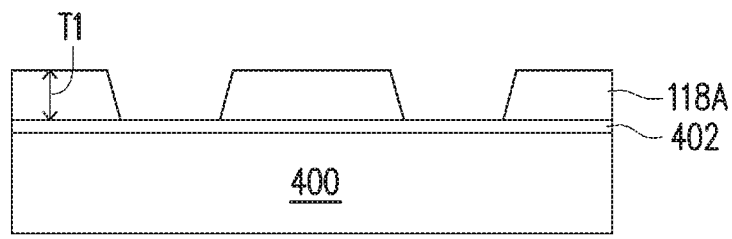
FIGS. 7A, 7B, 7C, 7D, and 7E illustrate cross-sectional views of various intermediary steps of forming a semiconductor package in accordance with some alternative embodiments.

FIG. 7A illustrates the dielectric layer 118A after patterning on the carrier substrate 400 and the release film 402. The dielectric layer 118A may be used as a stress buffer layer for subsequently formed conductive features, and may have a thickness in the range of 5 µm to 45 µm in some embodiments. In some embodiments, thickness T1 of the dielectric layer 118A is at least 15 µm when the redistribution layer 116A has a pitch of 2 µm or less in order to provide sufficient stress relief between the conductive connectors 122 and the redistribution layer 116A. Openings are patterned in the dielectric layer 118A to expose portions of the release film 402. The deposition and patterning of the dielectric layer 118A may be similar to that described above in FIG. 4A and is not repeated herein for brevity.

Figure 7B:
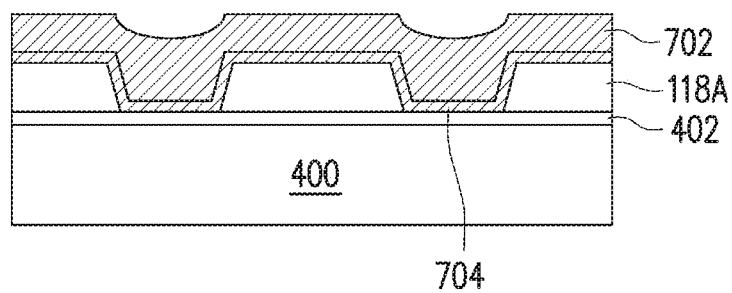

In FIG. 7B, a conductive material 702 is formed over the dielectric layer 118A and in the openings of the dielectric layer 118A. As an example to form the conductive material 702, a seed layer 704 is formed over the dielectric layer 118A. In some embodiments, the seed layer 704 is a metal layer, which may be a single layer or a composite layer comprising a plurality of sub-layers formed of different materials. In some embodiments, the seed layer 704 comprises a titanium layer and a copper layer over the titanium layer. The seed layer 704 may be formed using, for example, PVD or the like. The conductive material 702 is formed on the seed layer 704. The conductive material 702 may be formed by plating, such as electroplating or electroless plating, or the like. The conductive material 702 may comprise a metal, like copper, titanium, tungsten, aluminum, or the like.

Figure 7C:
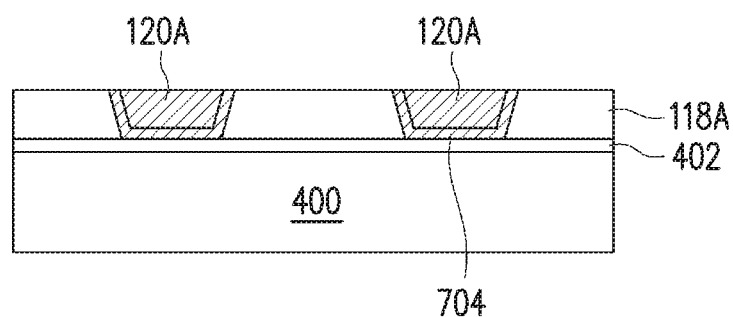

In FIG. 7C, a planarization process (e.g., a mechanical grinding, a CMP, or the like) is applied to the top surfaces of the conductive material 702 (see FIG. 7B) and the dielectric layer 118A. In some embodiments, the planarization process levels top surfaces of the conductive material 702 to define the conductive vias 120A. For example, a top surface of the conductive vias 120A has a greater degree of planarity than the conductive material 702 prior to planarization. Further, after planarization, top surfaces of the conductive vias 120A and the dielectric layer 118A may be substantially coplanar.

Figure 7D:
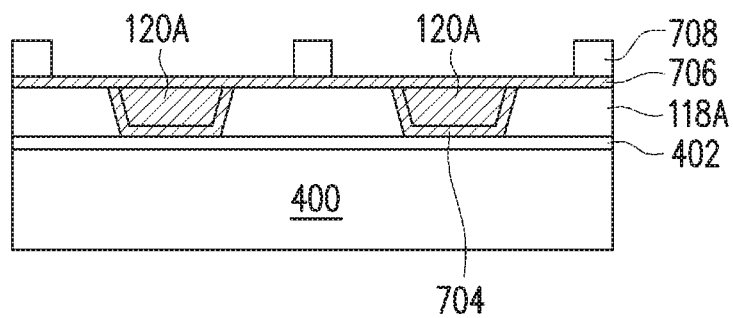

In FIG. 7D, a seed layer 706 is formed over the dielectric layer 118A and the conductive vias 120A. In some embodiments, the seed layer 706 is a metal layer, which may be a single layer or a composite layer comprising a plurality of sub-layers formed of different materials. In some embodiments, the seed layer 706 comprises a titanium layer and a copper layer over the titanium layer. The seed layer 706 may be formed using, for example, PVD or the like.

As also illustrated in FIG. 7D, a photo resist 708 is formed and patterned on the seed layer 706. The photo resist may be formed by spin coating or the like and may be exposed to light for patterning. The pattern of the photo resist 708 corresponds to the redistribution layer 116A (see FIG. 7E). The patterning forms openings through the photo resist to expose the seed layer 706.

Figure 7E:
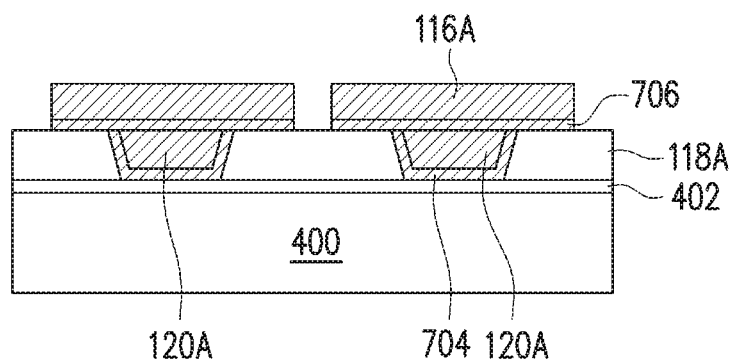

In FIG. 7E, a conductive material (e.g., redistribution layer 116A) is formed in the openings of the photo resist 708 and on the exposed portions of the seed layer 706. The conductive material may be formed by plating, such as electroplating or electroless plating, or the like. The conductive material may comprise a metal, like copper, titanium, tungsten, aluminum, or the like. Then, the photo resist 708 and portions of the seed layer 706 on which the conductive material is not formed are removed. The photo resist 708 may be removed by an acceptable ashing or stripping process, such as using an oxygen plasma or the like. Once the photo resist 708 is removed, exposed portions of the seed layer 706 are removed, such as by using an acceptable etching process, such as by wet or dry etching. The remaining portions of the seed layer 706 and conductive material form the redistribution layer 116A.

FIGS. 8A through 8E illustrate various intermediary process steps of forming the conductive vias 120A and the redistribution layer 116A when a thicker dielectric layer 118A is used as a stress buffer layer according to alternative embodiments. For example, the embodiment processes described with respect to FIGS. 8A through 8E may be used in combination with the embodiments described in FIGS. 5A, 5B, 6A, and 6B. Because a relatively thick dielectric layer 118A is deposited, consideration may be taken into account for the formation of the conductive vias 120A and the redistribution layer 116A in order to provide a sufficiently level topography for a top surface of the redistribution layer 116A.

Figure 8A:
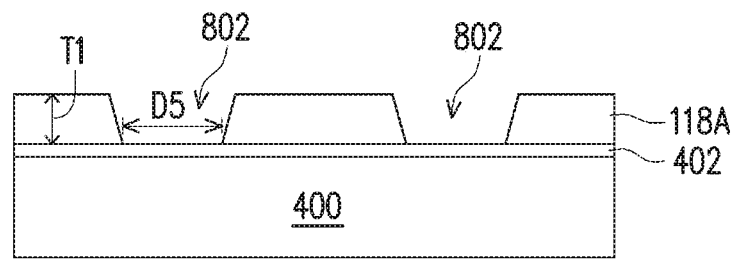
FIGS. 8A, 8B, 8C, 8D, and 8E illustrate cross-sectional views of various intermediary steps of forming a semiconductor package in accordance with some alternative embodiments.

FIG. 8A illustrates the dielectric layer 118A after patterning on the carrier substrate 400 and the release film 402. The dielectric layer 118A may be used as a stress buffer layer for subsequently formed conductive features, and may have a thickness T1 in the range of 5 µm to 45 µm in some embodiments. In some embodiments, thickness T1 of the dielectric layer 118A is at least 15 µm when the redistribution layer 116A has a pitch of 2 µm or less in order to provide sufficient stress relief between the conductive connectors 122 and the redistribution layer 116A. Openings 802 are patterned in the dielectric layer 118A to expose portions of the release film 402. The deposition and patterning of the dielectric layer 118A may be similar to that described above in FIG. 4A and is not repeated herein for brevity. A diameter D5 of openings 802 in the dielectric 118 may be relatively large (e.g., larger than the embodiment of FIG. 4A or 7A). For example, in some embodiments, diameter D5 may be in the range of 25 µm to 45 µm.

Figure 8B:
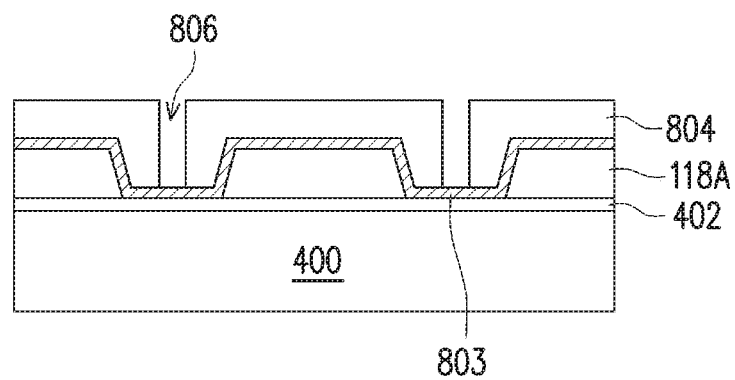

In FIG. 8B, a seed layer 803 is formed over the dielectric layer 118A and in the openings 802 (see FIG. 8A). In some embodiments, the seed layer 803 is a metal layer, which may be a single layer or a composite layer comprising a plurality of sub-layers formed of different materials. In some embodiments, the seed layer 803 comprises a titanium layer and a copper layer over the titanium layer. The seed layer 803 may be formed using, for example, PVD or the like.

As also illustrated in FIG. 8B, a photo resist 804 is formed and patterned on the seed layer 803. The photo resist 804 may be formed by spin coating or the like and may be exposed to light for patterning to define openings 806, which expose the seed layer 803. The openings 806 may be disposed within the openings 802 and partially expose portions of the seed layer 803 in the openings 802. For example, a width of the openings 806 is less than a width of the openings 802.

Figure 8C:
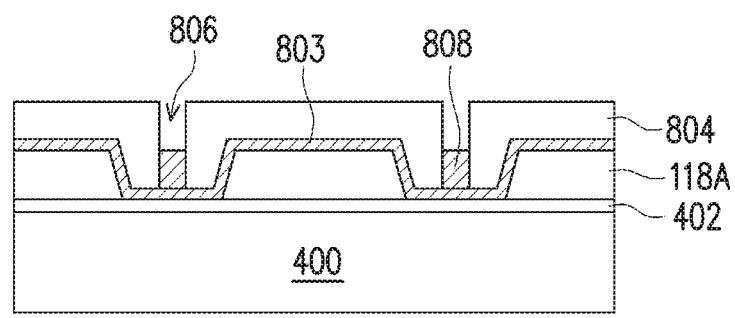

In FIG. 8C, a conductive material 808 is formed in the openings 806 of the photo resist 804 and on the exposed portions of the seed layer 803. The conductive material 808 may be formed by plating, such as electroplating or electroless plating, or the like. The conductive material 808 may comprise a metal, like copper, titanium, tungsten, aluminum, or the like. After the conductive material 808 is formed, the photo resist 804 is removed. The photo resist 804 may be removed by an acceptable ashing or stripping process, such as using an oxygen plasma or the like. The conductive material 808 may be used to improve a planarity of top surfaces of the redistribution layer 116A formed in a subsequent plating step (see FIG. 8E).

Figure 8D:
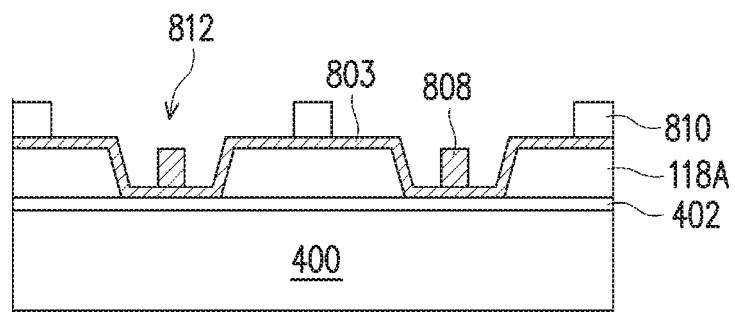

In FIG. 8D, a photo resist 810 is formed and patterned on the seed layer 803. The photo resist 810 may be formed by spin coating or the like and may be exposed to light for patterning to define openings 812, which expose the seed layer 803 and the conductive material 808. The openings 812 may be wider than the openings 802 and 806, and a pattern of the openings 812 may correspond with a pattern of redistribution layer 116A (see FIG. 8E).

Figure 8E:
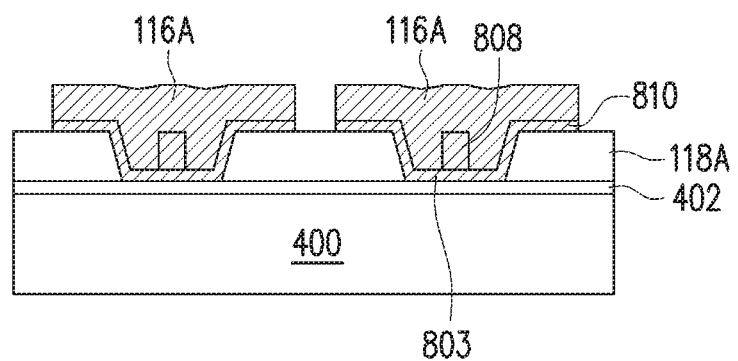

In FIG. 8E, a conductive material is formed in the openings 812 of the photo resist 810 and on the exposed portions of the seed layer 803 as well as the conductive material 808. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer 803, the conductive material 808, and the conductive material plated in FIG. 8E form the metallization pattern (including the conductive vias 120A and the redistribution layer 112A). Because the conductive material 808 is included in the plating process, a top surface of the redistribution layer 116A may have improved planarity compared to embodiments where the conductive material 808 is excluded.

Figure 9A:
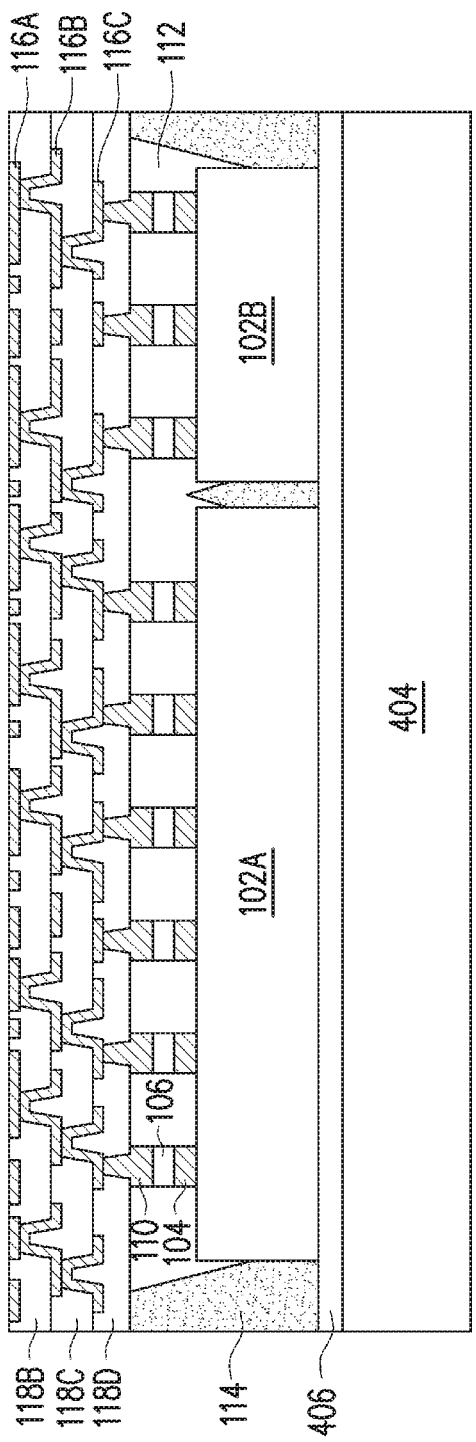
FIGS. 9A, 9B, and 9C illustrate cross-sectional views of various intermediary steps of forming a semiconductor package in accordance with some alternative embodiments.
Figure 9B:
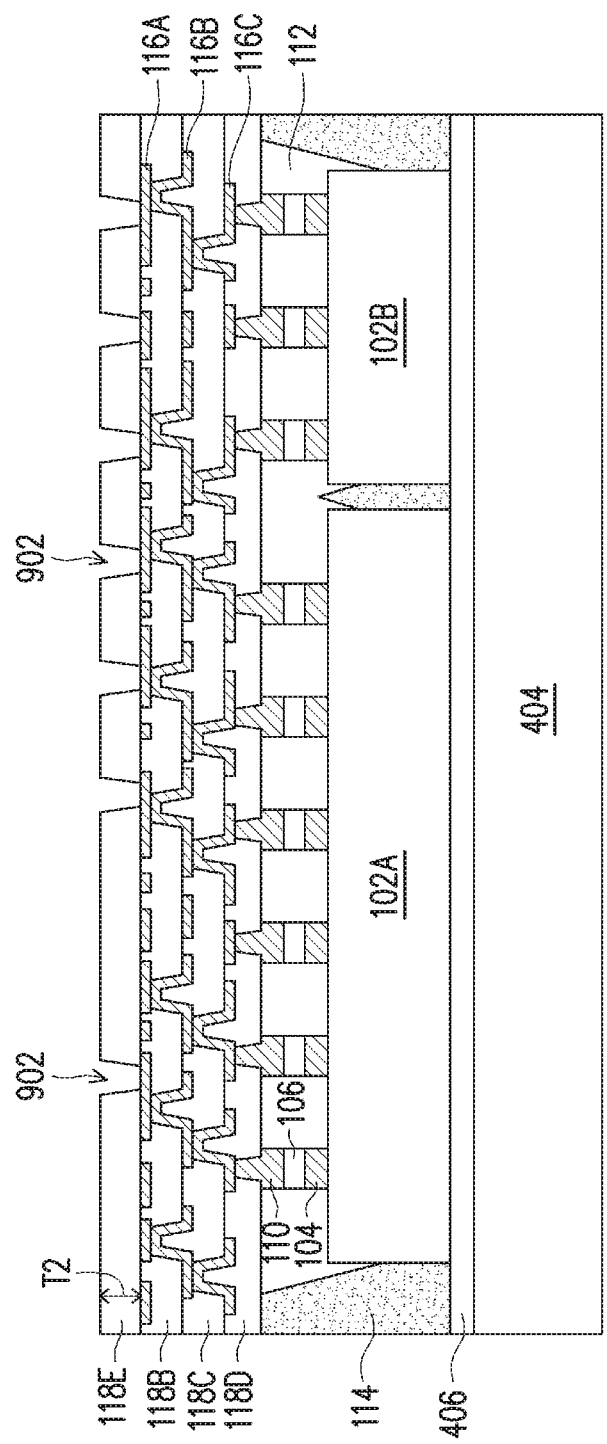
Figure 9C:
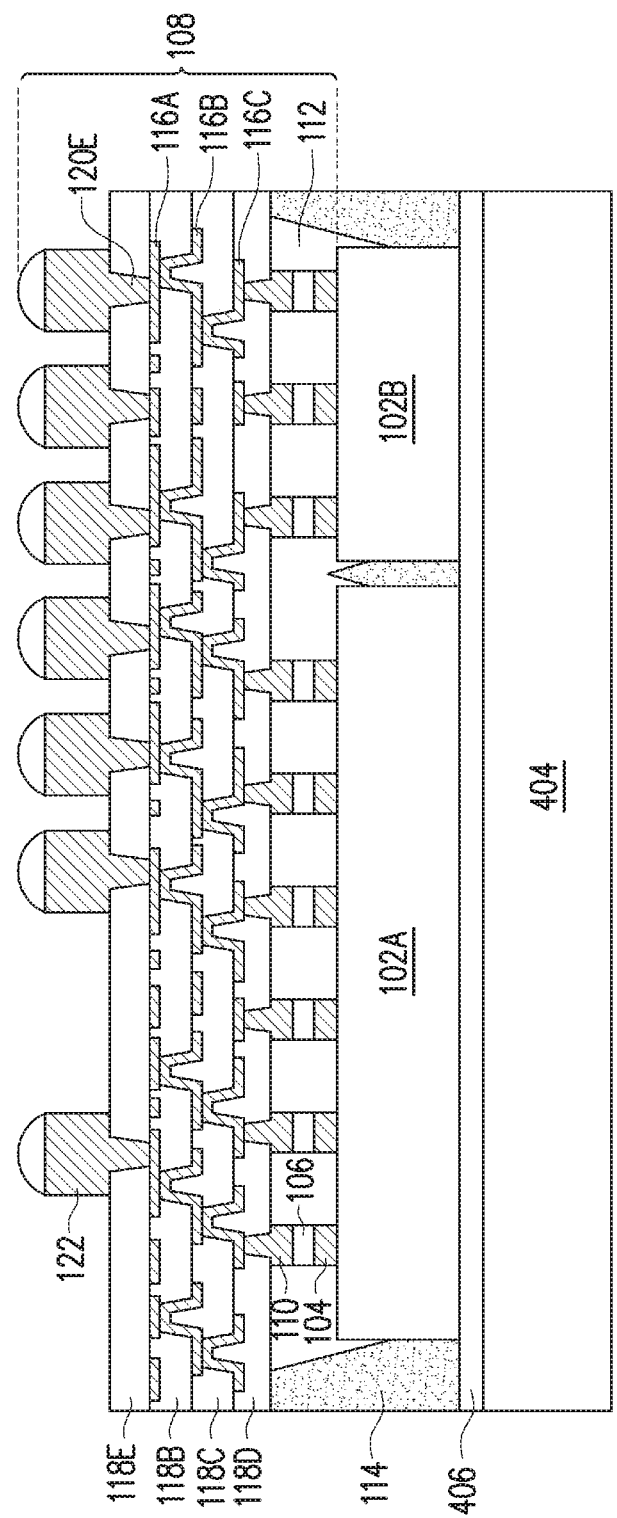

FIGS. 9A through 9C illustrate intermediary process steps of forming a redistribution structure 108 according to other embodiments. In FIGS. 9A through 9C, the dielectric layer 118A and the conductive vias 120A may be omitted, and the dielectric layer 118E is used as a stress buffer layer to mitigate stress between conductive connectors 122 (see FIG. 9C) and redistribution layers 116A, 116B, and 116C. As such, a thickness T2 of the dielectric layer 118E may be greater than respective thicknesses of the dielectric layers 118B, 118C, and 118D. For example, a thickness of each of the dielectric layers 118B, 118C, and 118D may be in the range of 5 µm to 7 µm while a thickness T2 of the dielectric layer 118E may be in the range of 5 µm to 45 µm. In some embodiments, thickness T2 of the dielectric layer 118E is at least 15 µm when the redistribution layer 116A has a pitch of 2 µm or less in order to provide sufficient stress relief between the conductive connectors 122 and the redistribution layer 116A. By providing a thicker dielectric layer 118E, stress buffering may be achieved without including the dielectric layer 118A.

FIG. 9A illustrates an intermediary formation step after devices 102A and 102B are bonded to contacts 110. As discussed above, in the embodiments of FIGS. 9A through 9C, the dielectric layer 118A and the conductive vias 120A are omitted. Thus, removing the carrier 400 (see FIG. 4H) exposes the dielectric layer 118B and the redistribution layer 116A. The various process steps to form features illustrated in FIG. 9A are described above in FIGS. 1A, 1B, 1C, 2A, 2B, 2C, 3, and 4A through 4H except for the omission of dielectric layers 118A and conductive vias 120A where like reference numerals indicate like elements formed using like processes. Because the dielectric layer 118A and the conductive vias 120A are excluded, the redistribution layer 116A may be formed directly on a release film (e.g., release film 402, see FIG. 4A) over a carrier substrate (e.g., carrier substrate 400, see FIG. 4A).

In FIG. 9B, dielectric layer 118E is deposited and patterned on the dielectric layer 118A. In some embodiments, the dielectric layer 118E may be formed by any acceptable deposition process, such as spin coating, CVD, laminating, the like, or a combination thereof. A thickness T2 of the dielectric layer 118E may be at least 15 µm to provide sufficient stress buffering between subsequently formed conductive connectors 122 (see FIG. 9C) and the redistribution layer 116A. After deposition, the dielectric layer 118E is then patterned to form openings 902 to expose portions of the immediately underlying layer. For example, openings 902 may expose the redistribution layer 116A. The patterning may be by an acceptable process, such as by exposing the dielectric layer 118E to light when the dielectric layer is a photo-sensitive material or by etching using, for example, an anisotropic etch.

The pattern of openings 902 in the dielectric layer 118E may correspond to a pattern of subsequently formed conductive vias 120E (see FIG. 9C). Furthermore, as a result of the patterning process of the openings 902, a diameter of the openings 902 may continuously decrease in a direction towards the redistribution layer 116A.

FIG. 9C illustrates the formation of a metallization pattern over the dielectric layer 118E. The metallization pattern includes conductive vias 120E and conductive connectors 122. As an example to form metallization pattern, a seed layer is formed over the dielectric layer 118E. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. The seed layer may be deposited to extend through openings 902 (see FIG. 9B) in the dielectric layer 118E. A photo resist is then formed and patterned on the seed layer. The photo resist may be formed by spin coating or the like and may be exposed to light for patterning. The pattern of the photo resist corresponds to the conductive connectors 122. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern (including the conductive vias 120E and the conductive connectors 122). Subsequently, solder regions may be formed on the conductive connectors 122 through methods such as evaporation, electroplating, printing, solder transfer, ball placement, or the like. Thus, a redistribution structure 108 according to an embodiment may be formed. Subsequent processing steps may be applied, for example, as described above with respect to FIG. 4K to bond a package substrate to the redistribution structure 108.

Figure 10A:
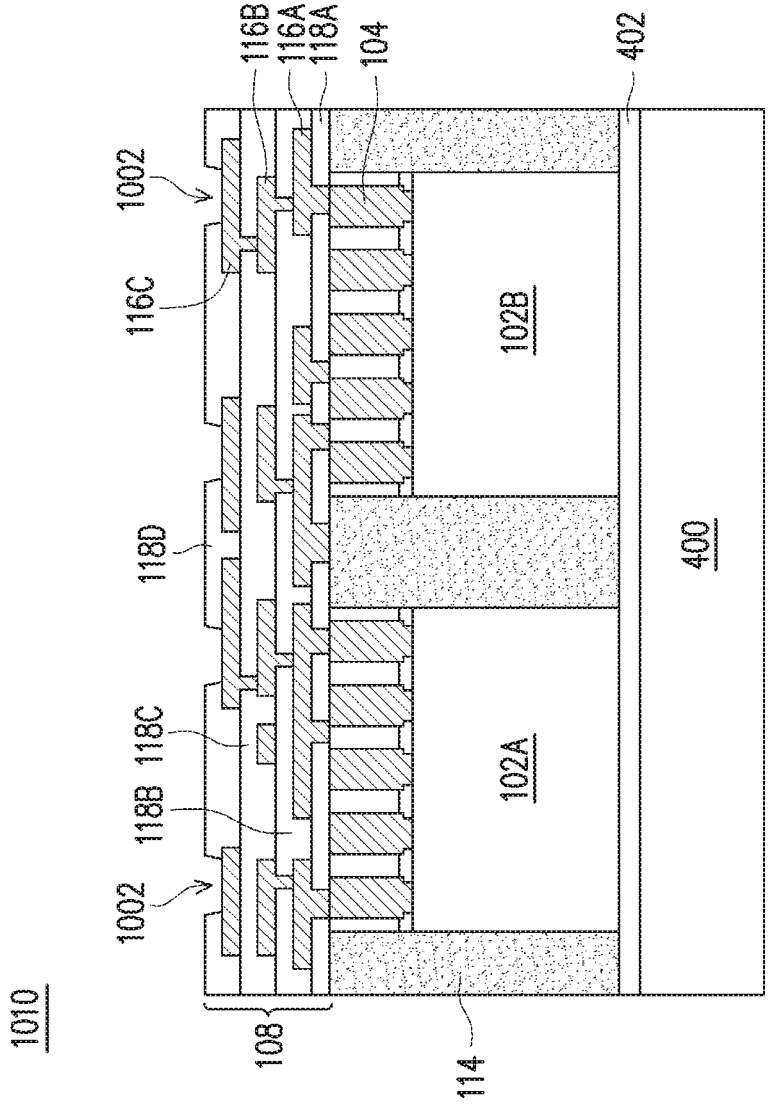
FIGS. 10A, 10B, and 10C illustrate cross-sectional views of various intermediary steps of forming a semiconductor package in accordance with some alternative embodiments.
Figure 10B:
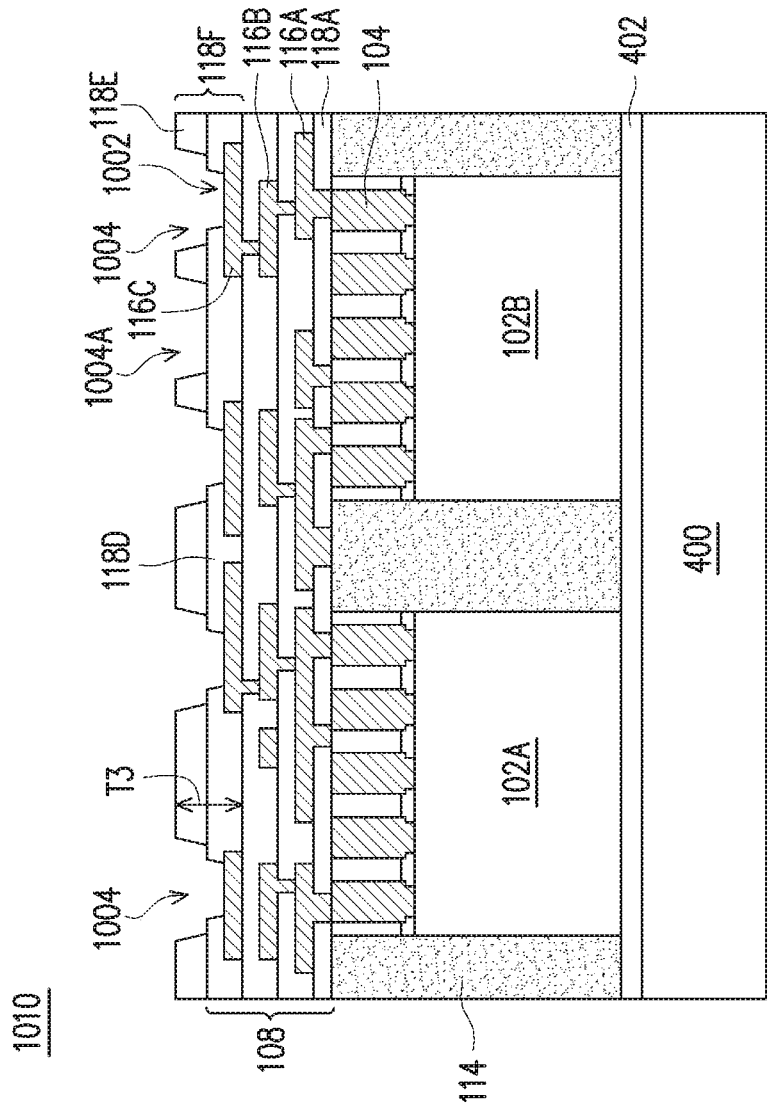
Figure 10C:
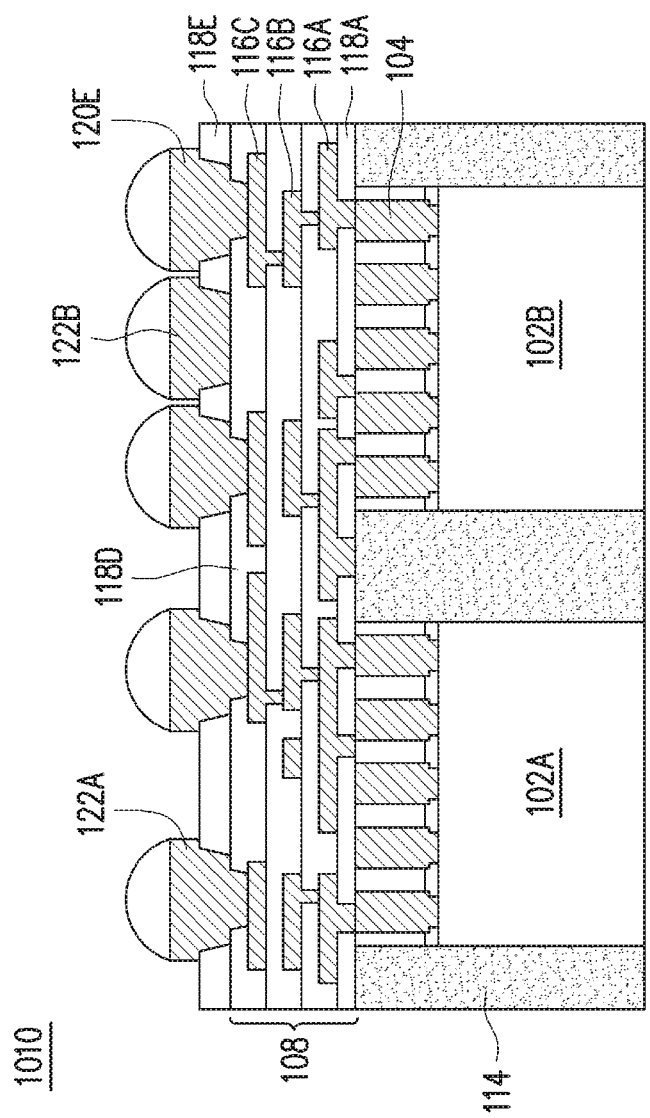

FIGS. 10A through 10C illustrate cross-sectional views of intermediary steps of forming an embodiment package 1010 according to alternative embodiments. Various features of package 1010 are similar to package 100 as described above with respect to FIGS. 1A, 1B, 1C, 2A, 2B, 2C, 3, and 4A through 4K where like reference numerals indicate like elements formed using like processes. However, while package 100 describes a process where devices 102A and 102B are bonded to redistribution structure 108 after various features of redistribution structure 108 are formed, in package 1010, the redistribution structure 108 is formed directly on devices 102A and 102B. For example, devices 102A and 102B may be encapsulated in a molding compound 114, and various dielectric layers 118A, 118B, 118C, and 118D are sequentially dispensed and patterned on the encapsulated devices 102A and 102B using similar processes as described above. Between patterned dielectric layers 118A, 118B, 118C, and 118D, redistribution layers 116A, 116B, and 116C are sequentially formed using similar processes as described above.

In FIG. 10A, a redistribution structure 108 is formed over the encapsulated devices 102A and 102B while the devices 102A and 102B are attached to a carrier substrate 400 by a release film 402. Openings 1002 are patterned in an exposed, outermost dielectric layer (e.g., dielectric layer 118D) of the redistribution structure 108. The openings 1002 may expose the underlying redistribution layer 116C. The patterning may be by an acceptable process, such as by exposing the dielectric layer 118D to light when the dielectric layer 118D is a photo-sensitive material or by etching using, for example, an anisotropic etch. In embodiments where the dielectric layer 118D is a photo-sensitive layer, a curing process (e.g., an anneal) may be performed after the patterning so that the dielectric layer 118D is no longer photo-sensitive.

In FIG. 10B dielectric layer 118E is deposited and patterned on the dielectric layer 118D. In some embodiments, the dielectric layer 118E may be formed by any acceptable deposition process, such as spin coating, CVD, laminating, the like, or a combination thereof. After deposition, the dielectric layer 118E is then patterned to form openings 1004 to expose portions of the immediately underlying layer. For example, openings 1004 may be aligned with openings 1002 and may expose the redistribution layers 116C. At least a portion of the openings 1004 (e.g., opening 1004A) may expose the underlying dielectric layer 118D without exposing any conductive features or any openings 1002. The patterning may be by an acceptable process, such as by exposing the dielectric layer 118E to light when the dielectric layer is a photo-sensitive material or by etching using, for example, an anisotropic etch. The pattern of openings 1004A in the dielectric layer 118E may correspond to a pattern of subsequently formed conductive vias 120E (see FIG. 10C). The openings 1004A may have a greater width than the openings 1002.

Further, in package 1010, the dielectric layers 118D and 118E in combination provide a stress buffer layer 118F. A thickness T3 of the stress buffer layer 118F may be at least about 15 μm to provide sufficient stress relief between subsequently formed conductive connectors 122 (see FIG. 10C) and redistribution layer 116C.

FIG. 10C illustrates the formation of a metallization pattern over the dielectric layer 118E. The metallization pattern includes conductive vias 120E and conductive connectors 122. The conductive connectors 122 include functional connectors 122A and optional dummy connectors 122B. As an example to form metallization pattern, a seed layer is formed over the dielectric layer 118E. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. The seed layer may be deposited to extend through openings in the dielectric layer 118E. A photo resist is then formed and patterned on the seed layer. The photo resist may be formed by spin coating or the like and may be exposed to light for patterning. The pattern of the photo resist corresponds to the conductive connectors 122. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern (including the conductive vias 120E and the conductive connectors 122). Subsequently, solder regions may be formed on the conductive connectors 122 through methods such as evaporation, electroplating, printing, solder transfer, ball placement, or the like. Subsequent processing steps may be applied, for example, as described above with respect to FIG. 4K to bond a package substrate to the redistribution structure 108.

Various embodiments provide various features and/or advantages. Various embodiments may provide a fan-out package structure, which forms three or more redistribution layers prior to attaching devices. Each redistribution layer can comprise fine pitched conductive traces having a width and/or spacing of, for example, 2 um or less. Thus, the redistribution layers may meet minimum line width design rules, which increases the flexibility of design routing for signal and/or power/ground lines and provide improved electrical performance. To prevent these fine pitched traces from breakage, a thicker top dielectric layer is formed to reduce the stress applied to the redistribution layers. Various embodiments provide process methods to form a thicker top dielectric layer; a smaller surface contour for redistribution layers; and other features of the redistribution structure to be processed with reduced lithography process difficulty. In some embodiment, a pre-formed redistribution structure may include contacts (e.g., μbumps) for at least two dies or packages to be electrically connect to the pre-formed redistribution structure. Thus, various embodiments allow heterogeneous chips can be integrated in a single package with high interconnection density. Further, various thermally sensitive chips (e.g., DRAM chips) can be bonded to the redistribution structure after the redistribution structure is formed, which reduces thermal budget concerns regarding DRAM chip thermal degradation.

In accordance with an embodiment, semiconductor package includes a bare semiconductor chip; a packaged semiconductor chip adjacent the bare semiconductor chip; and a redistribution structure bonded to the bare semiconductor chip and the packaged semiconductor chip. The redistribution structure comprises a first redistribution layer having a first thickness; a second redistribution layer having a second thickness; and a third redistribution layer between the first redistribution layer and the second redistribution layer. The third redistribution layer having a third thickness greater than the first thickness and the second thickness. The package further includes an underfill disposed between the bare semiconductor chip and the redistribution structure and a molding compound encapsulating the bare semiconductor chip, the packaged semiconductor chip, and the underfill. A first surface of the bare semiconductor chip and a second surface of the packaged semiconductor chip are exposed by the molding compound. In an embodiment, the redistribution structure further comprises a first conductive via electrically connected to the second redistribution layer; and a second conductive via electrically connecting the first conductive via to an external connector of the semiconductor package, wherein a diameter of the first conductive via continuously decreases in a direction towards the second conductive via, and wherein a diameter of the second conductive via continuously decreases in a direction towards the first conductive via. In an embodiment, a diameter of the first conductive via is smallest at an interface between the first conductive via and the second conductive via. In an embodiment, the first conductive via extends through a first dielectric layer, wherein the second conductive via extends through a second dielectric layer, and wherein the first dielectric layer and the second dielectric layer have a combined thickness of at least 15 µm. In an embodiment, the first dielectric layer and the second dielectric layer have different material compositions. In an embodiment, the redistribution structure further comprises a dummy connector disposed on an opposing side of the redistribution structure as the bare semiconductor chip, wherein the dummy connector is electrically isolated from the bare semiconductor chip and the packaged semiconductor chip. In an embodiment, the dummy connector is embedded in a dielectric layer of the redistribution structure by a third conductive via. In an embodiment, the first thickness and the second thickness are each 2 µm or less.

In accordance with an embodiment, a semiconductor package includes a molding compound encapsulating a first device and a second device, wherein the first device is a bare chip, and wherein the second device is a packaged chip and a redistribution structure flip chip bonded to the first device and the second device. Surfaces of the first device and the second device opposite the redistribution structure are exposed by the molding compound. The redistribution structure comprises a first redistribution layer over the first device and the second device; a second redistribution layer over the first redistribution layer, the second redistribution layer providing a ground line; a third redistribution layer over the second redistribution layer; a first conductive via over and electrically connected to the third redistribution layer; and a second conductive via over and electrically connecting the first conductive via to an external connector. A diameter of the first conductive via continuously decreases in a direction towards the second conductive via, and a diameter of the second conductive via continuously decreases in a direction towards the first conductive via. The package further includes an underfill disposed between the first device and the redistribution structure, wherein the molding compound contacts a fillet of the underfill. In an embodiment, a diameter of the first conductive via at an interface between the first conductive via and the second conductive via is less than or equal to a diameter of the second conductive via at the interface between the first conductive via and the second conductive via. In an embodiment, the redistribution structure is flip chip bonded to a first device connector of the first device by a first solder region and flip chip bonded to a second device connector of the second device by a second solder region, wherein at least one of the first device connector or the second device connector comprises copper, nickel, palladium, gold, an intermetallic compound, or a combination thereof. In an embodiment, the first device is flip chip bonded to a contact of the redistribution structure by the first solder region, and wherein the contact comprises copper, nickel, or a combination thereof. In an embodiment, the contact has a different material composition than the first device connector. In an embodiment, the first redistribution layer and the second redistribution layer each provide signal routing between the first device and the second device. In an embodiment, the package further includes a dummy connector adjacent the external connector, wherein the dummy connector is electrically isolated from the first device and the second device. In an embodiment, the first conductive via extends through a first dielectric layer, wherein the second conductive via extends through a second dielectric layer, wherein the dummy connector is embedded in the redistribution structure by a third conductive via extending through the second dielectric layer, and wherein the first dielectric layer covers an entire surface of the third conductive via opposite the dummy connector.

In accordance with an embodiment, a semiconductor package includes an encapsulant encapsulating a first device and a second device, wherein the first device is a bare die, and wherein the second device is a packaged die; and a redistribution structure bonded to the first device and the second device. Surfaces of the first device and the second device opposite the redistribution structure are not covered by the encapsulant. The redistribution structure comprises: a first redistribution layer over the first device and the second device; a second redistribution layer over the first redistribution layer; a first conductive via extending from the first redistribution layer to the second redistribution layer; a third redistribution layer over the second redistribution layer; a second conductive via extending from the second redistribution layer to the third redistribution layer, wherein a longitudinal axis of the first conductive via extends through a center of the first conductive via and a center of the second conductive via in a cross-sectional view; a third conductive via over and electrically connected to the third redistribution layer, the third conductive via comprising a first seed layer; and a fourth conductive via over and electrically connecting the third conductive via to an external connector, the fourth conductive via comprising a second seed layer contacting the first seed layer at an interface between the third conductive via and the fourth conductive via. The package further includes an underfill disposed between the first device and the redistribution structure, wherein the encapsulant is disposed around the underfill. In an embodiment, the package further includes a fifth conductive via physically separated from the third conductive via, the fifth conductive via electrically connecting the fourth conductive via to the third redistribution layer. In an embodiment, the first conductive via extends through a first dielectric layer, and a thickness of the first conductive via along a sidewall of the first dielectric layer is substantially equal to a thickness of a lateral portion of the first conductive via. In an embodiment, the first device is physically separated from the second device by a distance in a range of 50 µm to 300 µm, the distance being measured along a line parallel to a major surface of the redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
a first semiconductor chip;
a packaged semiconductor chip adjacent the first semiconductor chip;
a redistribution structure bonded to the first semiconductor chip and the packaged semiconductor chip, wherein the redistribution structure comprises:
a first redistribution layer comprising a first conductive line in a first dielectric layer, the first dielectric layer having a first thickness;
a second redistribution layer comprising a second conductive line in a second dielectric layer, the second conductive line having a second thickness;
a third redistribution layer comprising a third conductive line in a third dielectric layer, the third dielectric layer is between the first dielectric layer and the second dielectric layer, the third conductive line having a third thickness greater than a first thickness of the first conductive line and the second thickness of the second conductive line; and
a dummy connector disposed on an opposing side of the redistribution structure as the first semiconductor chip, wherein the dummy connector is electrically isolated from the first semiconductor chip and the packaged semiconductor chip;
an underfill disposed between the first semiconductor chip and the redistribution structure; and
a molding compound encapsulating the first semiconductor chip, the packaged semiconductor chip, and the underfill, wherein a first surface of the first semiconductor chip and a second surface of the packaged semiconductor chip are exposed by the molding compound.

2. The semiconductor package of claim 1, wherein the redistribution structure further comprises:
a first conductive via electrically connected to the second conductive line; and
a second conductive via electrically connecting the first conductive via to an external connector of the semiconductor package, wherein a diameter of the first conductive via continuously decreases in a direction towards the second conductive via, and wherein a diameter of the second conductive via continuously decreases in a direction towards the first conductive via.

3. The semiconductor package of claim 2, wherein a diameter of the first conductive via is smallest at an interface between the first conductive via and the second conductive via.

4. The semiconductor package of claim 2, wherein the first conductive via extends through a third dielectric layer, wherein the second conductive via extends through a fourth dielectric layer, and wherein the third dielectric layer and the fourth dielectric layer have a combined thickness of at least 15 µm.

5. The semiconductor package of claim 4, wherein the third dielectric layer and the fourth dielectric layer have different material compositions.

6. The semiconductor package of claim 1, wherein the dummy connector is embedded in a dielectric layer of the redistribution structure by a third conductive via.

7. The semiconductor package of claim 1, wherein the first thickness and the second thickness are each 2 µm or less.

8. A semiconductor package comprising:
a molding compound encapsulating a first device and a second device, wherein the first device is a first chip, and wherein the second device is a packaged chip;
a redistribution structure flip chip bonded to the first device and the second device, wherein surfaces of the first device and the second device opposite the redistribution structure are exposed by the molding compound, and wherein the redistribution structure comprises:
a first redistribution layer over the first device and the second device;
a second redistribution layer over the first redistribution layer, the second redistribution layer providing a ground line;
a third redistribution layer over the second redistribution layer;
a first conductive via over and electrically connected to the third redistribution layer; and
a second conductive via over and electrically connecting the first conductive via to an external connector, wherein a diameter of the first conductive via continuously decreases in a direction towards the second conductive via, and wherein a diameter of the second conductive via continuously decreases in a direction towards the first conductive via; and
an underfill disposed between the first device and the redistribution structure, wherein the molding compound contacts a fillet of the underfill.

9. The semiconductor package of claim 8, wherein a diameter of the first conductive via at an interface between the first conductive via and the second conductive via is less than or equal to a diameter of the second conductive via at the interface between the first conductive via and the second conductive via.

10. The semiconductor package of claim 8, wherein the redistribution structure is flip chip bonded to a first device connector of the first device by a first solder region and flip chip bonded to a second device connector of the second device by a second solder region, wherein at least one of the first device connector or the second device connector comprises copper, nickel, palladium, gold, an intermetallic compound, or a combination thereof.

11. The semiconductor package of claim 10, wherein the first device is flip chip bonded to a contact of the redistribution structure by the first solder region, and wherein the contact comprises copper, nickel, or a combination thereof.

12. The semiconductor package of claim 11, wherein the contact has a different material composition than the first device connector.

13. The semiconductor package of claim 8, wherein the first redistribution layer and the second redistribution layer each provide signal routing between the first device and the second device.

14. The semiconductor package of claim 8 further comprising a dummy connector adjacent the external connector, wherein the dummy connector is electrically isolated from the first device and the second device.

15. The semiconductor package of claim 14, wherein the first conductive via extends through a first dielectric layer, wherein the second conductive via extends through a second dielectric layer, wherein the dummy connector is embedded in the redistribution structure by a third conductive via extending through the second dielectric layer, and wherein the first dielectric layer covers an entire surface of the third conductive via opposite the dummy connector.

16. A semiconductor package comprising:
   an encapsulant encapsulating a first device and a second device, wherein the first device is a first die, and wherein the second device is a packaged die;
   a redistribution structure bonded to the first device and the second device, wherein surfaces of the first device and the second device opposite the redistribution structure are not covered by the encapsulant, and wherein the redistribution structure comprises:
      a first redistribution layer over the first device and the second device;
      a second redistribution layer over the first redistribution layer;
      a first conductive via extending from the first redistribution layer to the second redistribution layer;
      a third redistribution layer over the second redistribution layer;
      a second conductive via extending from the second redistribution layer to the third redistribution layer, wherein a longitudinal axis of the first conductive via extends through a center of the first conductive via and a center of the second conductive via in a cross-sectional view;
      a third conductive via over and electrically connected to the third redistribution layer, the third conductive via comprising a first seed layer; and
      a fourth conductive via over and electrically connecting the third conductive via to an external connector, the fourth conductive via comprising a second seed layer contacting the first seed layer at an interface between the third conductive via and the fourth conductive via; and
   an underfill disposed between the first device and the redistribution structure, wherein the encapsulant is disposed around the underfill.

17. The semiconductor package of claim 16 further comprising a fifth conductive via physically separated from the third conductive via, the fifth conductive via electrically connecting the fourth conductive via to the third redistribution layer.

18. The semiconductor package of claim 16, wherein the first conductive via extends through a first dielectric layer, and wherein a thickness of the first conductive via along a sidewall of the first dielectric layer is substantially equal to a thickness of a lateral portion of the first conductive via.

19. The semiconductor package of claim 16, wherein the first device is physically separated from the second device by a distance in a range of 50 μm to 300 μm, the distance being measured along a line parallel to a major surface of the redistribution structure.

* * * * *